United States Patent [19]

Erps et al.

[11] 4,360,788
[45] Nov. 23, 1982

[54] PHASE-LOCKED LOOP FREQUENCY SYNTHESIZER

[75] Inventors: Floyd D. Erps, Stanwood, Wash.; Raymond L. Fried, Loveland, Colo.

[73] Assignee: John Fluke Mfg. Co., Inc., Everett, Wash.

[21] Appl. No.: 168,066

[22] Filed: Jul. 14, 1980

[51] Int. Cl.³ .............................................. H03L 7/18
[52] U.S. Cl. ..................................... 331/1 A; 331/25; 307/271; 328/15
[58] Field of Search ....................... 455/260, 183, 165; 328/14, 15, 155; 307/271; 331/1 A, 18, 25

[56] References Cited

U.S. PATENT DOCUMENTS

| 3,777,276 | 12/1973 | Klein ............................... 331/1 A X |
| 3,875,524 | 4/1975 | Harzer et al. ...................... 331/25 X |
| 4,206,425 | 6/1980 | Nossen ............................ 331/1 A X |
| 4,225,828 | 9/1980 | Watanabe et al. ............... 331/1 A X |

FOREIGN PATENT DOCUMENTS

| 19412 | 11/1980 | European Pat. Off. . |
| 2903700 | 8/1979 | Fed. Rep. of Germany . |
| 2026268 | 1/1980 | United Kingdom . |

OTHER PUBLICATIONS

"Phase–Locked Loop Data Book"; second edition, Aug. 1973; Motorola Inc., 1973; pp. 1–13.
Gillette, "The Digitphase Synthesizer" Frequency Technology, Aug. 1969, pp. 25–29.
Telewski et al. "Delay Lines Give RF Generator Spectral Purity, Programmability" Electronics, Aug. 1980, pp. 133–142.

*Primary Examiner*—Siegfried H. Grimm
*Assistant Examiner*—Edward P. Westin
*Attorney, Agent, or Firm*—Christensen, O'Connor, Johnson & Kindness

[57] ABSTRACT

A programmable divide-by-N phase-locked loop having a pulse incrementor circuit and a single sideband mixer circuit embedded in the loop feedback path is disclosed. In each disclosed arrangement, one input port of the single sideband mixer receives the signals supplied by the phase-locked loop voltage controlled oscillator and, depending upon whether the mixer employed is configured for supplying an upper sideband signal or a lower sideband signal, either increases or decreases the frequency of the phase-locked loop feedback signal by a factor $f_s$, where $f_s$ is the frequency of a control signal applied to the second input port of the signal sideband mixer. The pulse incrementor circuit receives the signal supplied by the single sideband mixer and, depending on whether the pulse incrementor is configured for deleting signal pulses or adding signal pulses, either decreases or increases the average frequency of the signals supplied to the phase-locked loop programmable divider by a factor $f_d$, where $f_d$ is the frequency of a control signal applied to the pulse incrementor. Since the phase-locked loop synchronizes or locks when the phase of the signal supplied by the programmable divider is equal to the phase of a reference frequency $f_r$, which is supplied to the phase-locked loop phase detector, the arrangement causes the phase-locked loop voltage controlled oscillator to supply a signal at a frequency of $Nf_r \pm f_d \pm f_s$, where N is the selected divisor of the phase-locked loop programmable divider and the operations of addition and subtraction are determined by the type of single sideband mixer and pulse incrementor utilized. To suppress spurious output signals, both control frequencies $f_d$ and $f_s$ are maintained substantially above the phase-locked loop cutoff frequency. Separate pulse incrementor circuits for pulse deletion and pulse addition are disclosed, along with a combined pulse deletor programmable divider which utilizes variable modulus prescaling techniques.

20 Claims, 9 Drawing Figures

PHASE-LOCKED LOOP FREQUENCY SYNTHESIZER

BACKGROUND OF THE INVENTION

This invention relates to the field of frequency synthesis. More particularly, this invention relates to phase-locked loop frequency synthesis in which a phase-locked loop is augmented to provide frequency resolution greater than that attainable with a conventional phase-locked loop circuit.

As is known in the art, the term "frequency synthesis" encompasses various methods and apparatus wherein a frequency conversion process is utilized to translate the signal frequency of one or more reference signals to a generally large number of output signal frequencies that are relatively stable in frequency and relatively pure in spectral content, each of which output frequencies can be individually selected as the frequency of the synthesizer output signal. As is further known, frequency synthesis is utilized in a wide range of applications in which a number of stable, spectrally pure signal frequencies are required. For example, to eliminate the large number of crystal controlled oscillators that would otherwise be required, frequency synthesis is often employed in channelized communication systems, especially those communication systems that employ frequency-hopping techniques, test and instrumentation systems, and frequency-agile radar systems.

Three basic frequency synthesis techniques have become known within the art and are commonly identified as direct frequency synthesis, indirect frequency synthesis and digital frequency synthesis. In apparatus employing direct frequency synthesis, the output frequencies are obtained directly from the frequency of one or more reference signals by the operations of mixing, filtering, frequency multiplication and frequency division. Indirect synthesizers derive the output frequency from a secondary oscillator that is either phase-locked or frequency-locked to the frequency of a reference signal. Hence, such indirect frequency synthesizers often employ conventional phase-locked loop circuits. In contrast, digital synthesis is a sampled data technique in which a reference signal determines an invariant sampling interval and real-time digital computation is employed to calculate signal amplitudes, which when filtered, result in an analog signal of the desired frequency.

Each of the basic frequency synthesis techniques exhibits performance characteristics that often make a particular type of frequency synthesizer preferable in a particular design situation. For example, circuits which employ only direct synthesis techniques are not especially well-suited for applications requiring the synthesis of a signal over a relatively wide frequency range, e.g., one or more octaves, since the output signals of such a circuit inherently exhibit a relatively low percentage bandwidth. Further, circuits employing direct frequency synthesis are generally complex, requiring a large number of circuit stages including a relatively large number of multiple pole filter arrangements.

Although various techniques, such as down conversion or heterodyning of the signal supplied by a direct synthesizer, have been developed to effectively expand the bandwidth of the output signal, these techniques are not entirely satisfactory. In particular, in such a heterodyning or beat-frequency system, the direct synthesis stages must operate at frequencies substantially higher than the final output frequency. This high frequency operation complicates the design of appropriate circuitry, often leads to substantial power consumption, generally results in a circuit of relatively high cost, and often increases the amount of noise or spurious signal components present in the synthesized output signal.

On the other hand, indirect synthesis techniques which employ phase-locked loop circuits have a relatively low parts count and are inherently capable of supplying a synthesized signal over a relatively wide frequency range. Because of this, a circuit arrangement commonly called a programmable divide-by-N phase-locked loop is often advantageous in situations where output bandwidth is of prime consideration.

Such a programmable divide-by-N phase-locked loop is essentially a feedback or simple servo system in which an error signal that is proportional to the phase difference between a feedback signal and a reference signal is generated within a phase detector circuit. This error signal is low-pass filtered and utilized to control the frequency of a voltage controlled oscillator circuit (VCO) which supplies the system output signal. In this arrangement, frequency control is effected by a programmable frequency divider circuit which is connected for receiving the output signal of the VCO and supplies the feedback signal to the phase detector. In particular, the programmable divider reduces the frequency of the feedback signal by a selectable factor N and, since the loop will synchronize or lock when the phase of the feedback signal is substantially identical to the phase of the reference signal, causes the VCO to supply a signal at the frequency $Nf_r$ where $f_r$ is the frequency of the reference signal.

Since N is an integer in conventional programmable dividers, the basic divide-by-N phase-locked loop is limited to a frequency resolution equal to the reference frequency $f_r$. Further, since the time required to switch from one output frequency to another is inversely proportional to $f_r$ and noise performance is generally degraded as $f_r$ is decreased, oftentimes a basic programmable divide-by-N phase-locked loop cannot simultaneously achieve the desired output bandwidth and frequency resolution along with a desired switching speed and the desired level of noise suppression. To overcome this drawback, several design approaches that are generally categorized as augmented phase-locked loops have been developed. For example, techniques which permit the programmable divisor N to take on noninteger values and multiple loop arrangements have been proposed.

Although prior art systems for augmenting a programmable divide-by-N phase-locked loop to thereby provide relatively wide bandwidth and relatively high frequency resolution have proven somewhat satisfactory under certain design situations, each of these systems generally suffers from one or more drawbacks. For example, often such arrangements are extremely complex in structure, hence increasing circuit cost and often decreasing circuit reliability. Further, such synthesis systems often require rather complex programming or switching circuits in order to establish the output frequency at a desired value.

Accordingly, it is an object of this invention to provide an augmented programmable divide-by-N phase-locked loop having a relatively high frequency resolution and a relatively wide output bandwidth, e.g., one or more octaves.

It is another object of this invention to provide an augmented phase-locked loop synthesizer circuit having a relatively low parts count, such circuit being capable of synthesizing an output signal over at least an octave wide frequency range with relatively high frequency resolution.

It is yet another object of this invention to provide an augmented phase-locked loop frequency synthesizer having a relatively wide output frequency range and relatively high frequency resolution in which a desired output frequency can be initiated by simple programming signals.

SUMMARY OF THE INVENTION

These and other objects are achieved in accordance with this invention by a circuit arrangement including a programmable divide-by-N phase-locked loop which is augmented by a pulse incrementor circuit and a single sideband mixer that are connected in cascade in the phase-locked loop feedback path. In particular, the single sideband mixer is connected for receiving the signal supplied by the phase-locked loop VCO and a selectable frequency mixer control signal to thereby supply a signal to the pulse incrementor circuit at a frequency $f_m = f_v \pm f_s$, where $f_m$, $f_v$ and $f_s$ are respectively the signal frequency supplied by the single sideband mixer, the signal frequency supplied by the VCO and the signal frequency of the mixer control signal, and where the operation of addition or subtraction respectively applies to a single sideband mixer of the upper sideband variety and a single sideband mixer of the lower sideband variety.

In accordance with the invention, the pulse incrementor circuit is arranged for either deleting signal pulses from the signal supplied by the single sideband mixer or for adding signal pulses to the signal supplied by the single sideband mixer each time a signal pulse is applied to a control terminal of the pulse incrementor. Thus, two types of pulse incrementor circuits, denoted herein as pulse adders and pulse deletors, are encompassed in the practice of the invention. Such pulse adders supply a signal to the programmable divider of the phase-locked loop at an average frequency of $f_m + f_d$, where $f_d$ is the frequency of the control signal applied to the pulse adder, whereas such pulse deletors supply a signal to the phase-locked loop programmable divider at a frequency of $f_m - f_d$. Since the programmable divider divides the signal by a selectable integer N and the phase-locked loop synchronizes or locks when the signal supplied by the programmable divider is substantially identical in phase or frequency to the phase-locked loop reference frequency $f_r$, the phase-locked loop VCO supplies an output signal at a frequency $f_v = Nf_r \pm f_d \pm f_s$, wherein the pulse incrementor frequency $f_d$ is additive in embodiments utilizing a pulse incrementor of the pulse deletor variety and is subtractive in embodiments utilizing a pulse adder circuit, and wherein the mixer control frequency $f_s$ is additive when a lower sideband mixer is employed and is subtractive when an upper sideband mixer is employed.

In the preferred embodiments of the invention a lower sideband mixer is utilized in conjunction with a pulse incrementor of the pulse deletor variety to supply a system output signal at the frequency $Nf_r + f_d + f_s$. Further, the values of various system parameters are preferably established such that the frequency of the mixer control signal establishes one or more digits of the frequency of the output signal that correspond to a like number of frequency decades; the selectable pulse deletion frequency $f_d$ establishes one or more additional digits of the output frequency that correspond to one or more additional decades of frequency resolution, and the selectable divisor N of the phase-locked loop programmable divider establishes one or more further digits of the output signal frequency that correspond to one or more additional frequency decades of resolution. For example, in one implementation of a disclosed embodiment of the invention, the mixer control frequency $f_s$ establishes the digits of the output frequency that correspond to hertz, tens of hertz, hundreds of hertz, and kilohertz; whereas the pulse deletion frequency $f_d$ controls those digits of the output frequency that correspond to tens of kilohertz and hundreds of kilohertz; and the programmable divisor N controls those digits of the output frequency corresponding to megahertz, tens of megahertz and hundreds of megahertz.

In each embodiment of the invention, the minimum nonzero values of the control frequencies $f_d$ and $f_s$ are maintained substantially above the phase-locked loop cutoff frequency to adequately suppress spurious output signals. Further, in situations in which greater suppression of spurious output signals is required, the circuit arrangement of the invention can be supplemented with an additional phase-locked loop embedded between the single sideband mixer and the pulse incrementor circuit. In such an arrangement, the additional phase-locked loop is of relatively narrow bandwidth to effectively serve as a tracking filter with respect to the desired sideband frequency of the single sideband mixer. Accordingly, undesired sideband signals, signal components at the mixer input frequencies $f_s$ and $f_v$, and undesired signal components at various intermodulation frequencies are further suppressed.

With respect to pulse incrementor circuits, suitable for the practice of this invention, individual circuit arrangements for effecting pulse addition and pulse deletion are disclosed. Additionally, in one disclosed embodiment of the invention, a combined pulse deletor programmable divider is utilized, which incorporates conventional logic circuits and the technique of variable modulus prescaling. In this embodiment of the invention, additional logic circuitry is provided for fully synchronous operation in which the selectable mixer control frequency $f_s$, the phase-locked loop reference frequency $f_r$, and the pulse deletion frequency $f_d$ are each derived from a single applied reference signal.

BRIEF DESCRIPTION OF THE DRAWINGS

Other objects and advantages of the present invention will become apparent to one skilled in the art after a reading of the following description, taken together with the accompanying drawings, in which.

DETAILED DESCRIPTION

Figure 1:
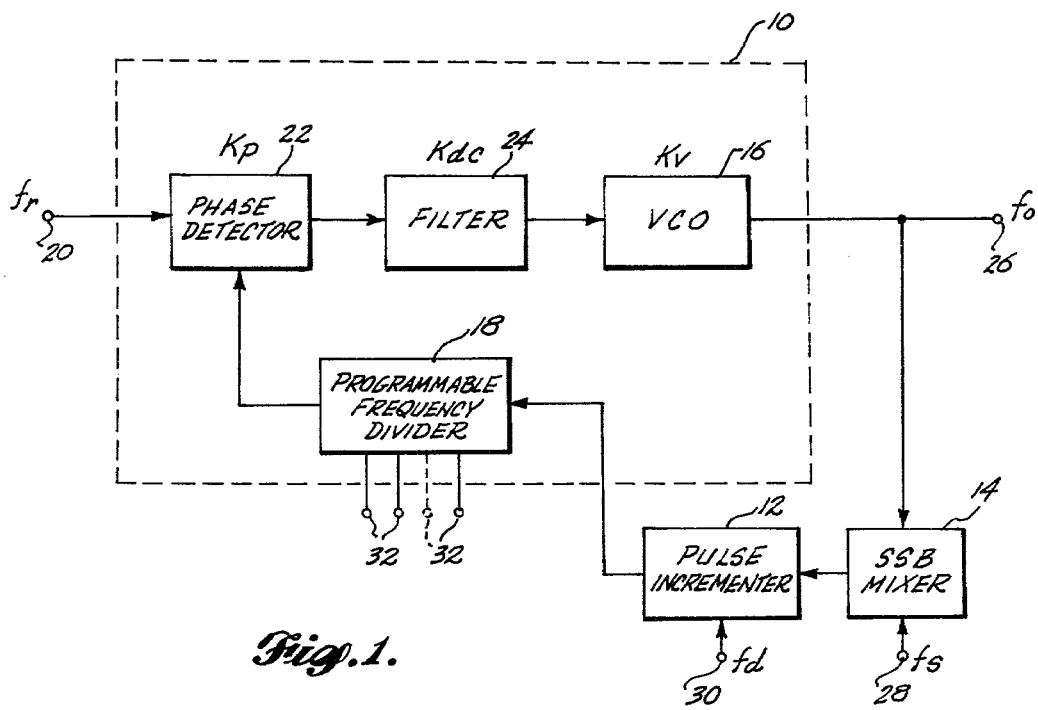
FIG. 1 is a block diagram of a frequency synthesizer constructed in accordance with this invention.

Referring to FIG. 1, this invention includes a programmable divide-by-N phase-locked loop, depicted within the dashed outline 10, augmented with a pulse incrementor 12 and a single sideband mixer 14. As shall be described in more detail hereinafter, the pulse incrementor 12 and single sideband mixer 14 control the average pulse rate or frequency of the signal coupled from a voltage controlled oscillator (VCO) 16 to a programmable divider 18 to cause the phase-locked loop to lock or synchronize at a frequency other than at the conventional phase-locked loop frequency $Nf_r$, where N is the integral divisor established in the programmable divider 18 and $f_r$ is the frequency of the reference signal applied to an input terminal 20. More specifically, in accordance with this invention, the pulse incrementor 12 and the single sideband mixer 14 alter or offset the frequency of a phase-locked loop feedback signal from that of a conventional phase-locked loop by a factor equal to sum or difference frequencies of $f_d$ and $f_s$, where $f_d$ and $f_s$ are, respectively, the average frequency of control signals applied to the pulse incrementor 12 and the single sideband mixer 14. Accordingly, the frequency synthesizer of this invention supplies an output signal having a frequency equal to $Nf_r \pm f_s \pm f_d$, where the operations of addition and subraction of $f_s$ and $f_d$ are respectively determined by the type of single sideband mixer 14 and the type of pulse incrementor 12 employed in a particular embodiment of the invention.

In viewing FIG. 1, those skilled in the art will recognize that, if the output signal supplied by the VCO 16 were directly connected to the programmable divider 18, rather than being connected through the pulse incrementor 12 and single sideband mixer 14, a conventional programmable divide-by-N phase-locked loop would be formed. In such a conventional divide-by-N phase-locked loop, the programmable divider 18 divides the frequency of the signal supplied by the VCO 16 and supplies a signal to one input terminal of a conventional phase detector 22. The phase detector 22 effectively compares the phase of the signal supplied by the programmable divider 18 with the phase of the reference signal $f_r$ (applied to the second input terminal of the phase detector 22), to supply an error signal having a magnitude proportional to the phase difference between the reference signal and the signal supplied by the programmable divider 18. Since frequency is the derivative of phase with respect to time, the error signal is accordingly related to the difference in frequency between the signal supplied by the programmable divider 18 and the reference frequency $f_r$. The error signal is low-pass filtered by a filter circuit 24 and supplied to control the frequency of the VCO 16. Since such a phase-locked loop is fundamentally a simple servo system which reaches a stable condition when the error signal is minimized, the loop is synchronized or locked when the two signals supplied to the phase detector are substantially identical in frequency, i.e., $f_v/N_f = f_r$, where $f_v$ is the frequency of the signal supplied by the VCO 16. Thus, in a conventional divide-by-N phase-locked loop, the VCO 16 supplies an output signal to an output terminal 26 at a frequency of $Nf_r$, where N is the divisor of the programmable divider 18. Since N is an integer in conventional programmable dividers, such a conventional divide-by-N phase-locked loop exhibits frequency resolution identically equal to the loop reference frequency $f_r$.

In accordance with this invention, the basic phase-locked loop, enclosed within dashed outline 10 of FIG. 1, is augmented with the pulse incrementor circuit 12 and the single sideband mixer to thereby provide frequency resolution greater than $f_r$ without substantially degrading frequency switching time or spurious noise generation. More specifically, one input port of the single sideband mixer 14 is connected for receiving the output signals supplied by the VCO 16 and a second input port of single sideband mixer 14 is connected to a terminal 28 for receiving a first control signal having a frequency of $f_s$. Since the single sideband mixer 14 is a conventional mixer circuit, configured for supplying an output signal having a primary signal component at either the upper or lower sideband frequency, the single sideband mixer 14 supplies a signal at a frequency $f_v + f_s$ (upper sideband) or at a frequency of $f_v - f_s$ (lower sideband) to the input terminal of the pulse incrementor 12.

Each pulse incrementor circuit 12 is utilized in the practice of this invention can be considered a three terminal logic circuit, which either adds a signal pulse to, or deletes a signal pulse from, the pulse train supplied by the single sideband mixer 14 with each signal pulse that is applied to a control terminal 30 of the incrementor 12. Thus, when a control signal having a frequency $f_d$ is applied to the terminal 30 and the pulse incrementor 12 adds pulses to the signal supplied by the single sideband mixer 14, the average pulse frequency of the signals supplied to the programmable divider 18 is increased by $f_d$. On the other hand, when the pulse incrementor 12 is configured for deleting pulses, the average pulse frequency of the signal supplied to the programmable divider 18 is decreased by the factor $f_d$.

In view of the above description of the operation of the single sideband mixer 14 and the pulse incrementor 12, it can be recognized that the average frequency of the loop feedback signal that is applied to the programmable divider 18 can be established at $f_v - f_s - f_d$ by utilizing a lower sideband mixer and a "pulse deletor" pulse incrementor; can be established at $f_v + f_s + f_d$, by utilizing a upper sideband mixer and "pulse adder" pulse incrementor; can be established at $f_v - f_s + f_d$ by utilizing a lower sideband mixer in conjunction with a pulse adder; or can be established at $f_v + f_s + f_d$ by the use of an upper sideband mixer and pulse deletor. Upon a more thorough understanding of the invention, it will be recognized that each of these possible combinations of the two types of single sideband mixers and pulse incrementor circuits can be advantageous under specific design requirements. For clarity of description, the ensuing paragraphs concentrate on embodiments of the invention wherein the pulse incrementor 12 is of the pulse deletor type and single sideband mixer 14 is of the lower sideband variety. Since this configuration supplies an output signal at a frequency $Nf_r+f_d+f_s$, thus minimizing the reference frequency that is necessary to supply a given output frequency range, the combination of a lower sideband mixer 14 and pulse incrementor 12 of the pulse deletor type is often the preferred arrangement of the invention. It should, however, be recognized that the following description fully describes embodiments of the invention employing a pulse adder as a pulse incrementor 12 and/or an upper sideband mixer 14 by appropriately interchanging the operations of addition and subtraction in the disclosed mathematical relationships.

As stated above, when a lower sideband mixer 14 and a pulse deletor are employed, the frequency of the signal coupled to the programmable divider 18 is $f_v-f_s-f_d$. Since the programmable divider is a conventional digital circuit device such as a counter circuit that can be programmed to divide by an integer N in accordance with a binary encoded command signal supplied to appropriate circuit terminals (i.e., the terminals 32 in FIG. 1), the signal supplied to one input terminal of the phase detector 22 is at a frequency $(f_v-f_s-f_d)/N$.

As is known in the art, various circuit arrangements which approximate an ideal multiplier circuit can be utilized as a phase detector 22, with the type of circuit being employed generally depending on the frequency range of interest. For example, a phase detector of the digital frequency/phase detector variety, or of the sine wave variety can be employed. In any case, the phase detector 22 effectively compares the phase of the signal supplied by the programmable divider 18 with the phase of the reference signal applied to the terminal 20. Thus, the phase detector 22 supplies an error signal that is directly proportional to the instantaneous phase difference between the reference frequency $f_r$ and the frequency $(f_v-f_s-f_d)/N$ of the signal supplied by the programmable divider 18.

This error signal is low-pass filtered in a filter circuit 24 which attenuates high frequency components that may be included in the output signal of the phase detector 22. The filtered signal is then coupled to a conventional VCO 16 to control the frequency of the signal supplied by the VCO 16 to the output terminal 26 and to one input port of the single sideband mixer 14. As is known in the art, various voltage controlled oscillators are suitable for use within phase-locked loop circuits, including "YIG-tuned oscillators," "varactor diode-tuned oscillators" and oscillators of the integrator-Schmidt trigger type and the emitter-coupled multivibrator variety. As in the case of selecting a suitable circuit for use as the phase detector 22, the particular type of voltage controlled oscillator employed generally depends on the frequency range of interest. Further, it should be noted that various other controlled oscillators, such as current controlled oscillators, resistance controlled oscillators and light controlled oscillators can be utilized. In this respect, the term voltage controlled oscillator is utilized herein for convenience and clarity and should be understood to include various other controlled oscillators suitable for use in phase-locked loop arrangements.

Since the phase detector 22 will supply an error signal via the filter 24 to the VCO 16 unless the reference frequency $f_r$ is substantially identical to the frequency of the signal supplied by the programmable divider 18, it can be seen that, as long as the VCO 16 operates within the lock range, the VCO 16 will operate at a frequency of $Nf_r+f_s+f_d$. Accordingly, by controlling the pulse deletion frequency $f_d$ and by controlling the frequency $f_s$ of the signal supplied to the single sideband mixer 14, the output frequency $f_o$ of the signal supplied to the output terminal 26 can be established at virtually any desired frequency.

Generally it is advantageous to arrange the embodiments of the invention such that the parameters N, $f_d$ and $f_s$ individually control one or more significant digits of the output frequency $f_o$. In particular, in considering a number system having a base or radix B and selecting the reference frequency $f_r$ equal to $B^k$, where k is a positive integer, the output frequency $f_o=Nf_r+f_d+f_s$ can be expressed as $$f_o = (N_1B^{n-1} + N_2B^{n-2} + \ldots + N_nB^0)B^k + D_1B^{k-1} + D_2B^{k-2} + \ldots \\ D_mB^{k-m}S_1B^{k-m-1} + S_2B^{k-m-2} + \ldots \\ + S_pB^{k-m-p} + C \quad (1)$$

where the coefficients $N_i$, $i=1, 2, \ldots, n$ are established by the programmable divisor; the coefficients $D_i$, $i=1, 2, \ldots, m$ are established by the pulse incrementor frequency $f_d$; the coefficients $S_i = 1, 2, \ldots, p$ are established by the mixer control frequency $f_s$; n, m, p are integers; and C is a constant related to the minimum value of $f_s$, which, as shall be described, improves the spectral purity of the signal $f_o$.

For example, in one hereinafter described realization of the embodiment depicted in FIG. 3, which operates in the decimal number system, a reference frequency of 1 megahertz is utilized with a programmable divisor that can be established between 260 and 520 to control the significant digits of the output frequency that correspond to hundreds of megahertz, tens of megahertz and megahertz. In this circuit implementation, the pulse deletion frequency $f_d$ is selectable between zero and 990 kilohertz in increments or steps of 10 kilohertz, to control the hundred kilohertz digit and the ten kilohertz digit of the output frequency. To control the digits of the output frequency that correspond to kilohertz, hundreds of hertz, tens of hertz and hertz, this particular implementation of the invention utilizes a mixer control frequency $f_s$ variable between ten kilohertz and 19.999 kilohertz in increments or steps of 1 hertz. With respect to the parameters of Equation 1, it can thus be seen that this particular implementation of the invention utilizes a radix of 10 (B=10) wherein n=3, k=6, m=2, p=4 and C, the minimum value of $f_s$ equal to 10 kilohertz with the programmable divisor coefficient $N_1$ being controllable between 2 and 5 and the coefficients $N_2$, $N_3$, $D_1$, $D_2$, and the coefficients $S_1$ through $S_4$ each being controllable in integer steps between 0 and 9.

In the practice of this invention, the mixer input frequency $f_s$ is maintained substantially above the cutoff frequency of the phase-locked loop to thereby suppress spurious signal components and hence provide an output signal of sufficient spectral purity. In particular, it is known to those skilled in the art that state-of-the-art devices such as single sideband mixers, programmable dividers, and phase detectors do not supply spectrally pure signals at the respective output frequencies, but, because of what can be considered nonlinearities in their operating characteristics, supply signals that include signal components at various other frequencies. Although some of these signals components are noncoherent and hence can be considered to be random noise, a major portion of the more undesired signal components are coherent or deterministic in nature.

Figure 2:
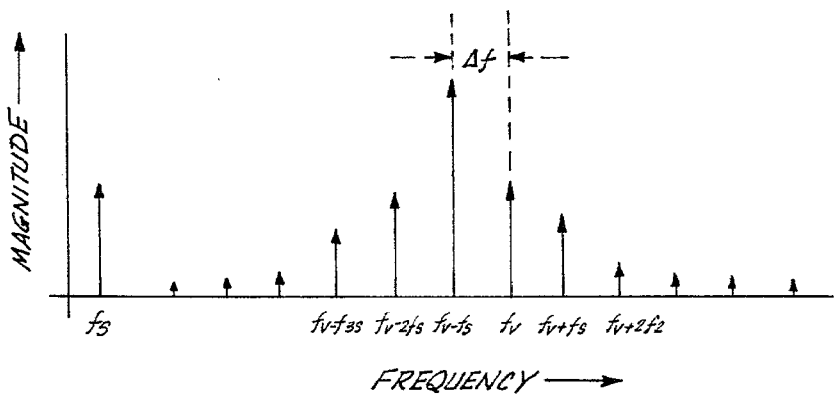
FIG. 2 is a frequency diagram depicting the more important frequency components supplied by a single sideband mixer of the arrangement of the invention depicted in FIG. 1.

For example, regardless of the care exercised in designing a single sideband mixer and embedding it within a phase-locked loop circuit, a state-of-the-art single sideband mixer does not supply a spectrally pure signal at the desired sideband frequency, but, due to the modulation process utilized in the mixer, supplies an output signal also having frequency components at the frequency of the two mixer input signals, at the other sideband frequency, and at intermodulation frequencies which are equal to the sum and difference between various harmonics of the mixer input signals. With respect to an embodiment of FIG. 1, in which a lower sideband mixer 14 is employed, this situation is illustrated by the frequency diagram of FIG. 2. As can be seen in FIG. 2, such a lower sideband mixer 14 supplies a signal to the pulse deletor circuit 12 which not only includes the desired lower sideband frequency of $f_v - f_s$, but also includes signal components at the VCO frequency $f_v$, at the upper sideband frequency $f_v + f_s$, and at various intermodulation frequencies equal to $af_v - bf_s$ and $af_v + bf_s$, where a and b are integers. Each of the undesired signal components are spaced apart from one another by a frequency interval equal to $f_s$, and due to the operation of the single sideband mixer, generally decrease in magnitude in proportion to the frequency separation ($f_s$, $2f_s$, . . . ) between any particular signal component and the desired frequency component $f_v - f_s$.

To adequately suppress the undesired frequency components supplied by the mixer 14 and hence prevent these signal components from appearing as coherent spurious signals in the output signal supplied to the terminal 26, the minimum value of the frequency $f_s$ utilized in the practice of this invention is maintained substantially above the phase-locked loop cutoff frequency. More explicitly, as is known to those skilled in the art, a phase-locked loop exhibits a cutoff frequency $F_{CO}$ which is substantially equal to $K_p K_v K_{dc}/N$, where $K_p$, $K_v$, and $K_{dc}$ are, respectively, the phase detector coefficient of the phase detector 22 (i.e., the change in the phase detector output voltage per radian of phase difference between the two applied signals), the VCO coefficient of the VCO 16 (i.e., the change in VCO frequency in hertz per volt change in control signal), and the dc gain of the filter 24. For example, in the previously mentioned implementation of the invention utilizing a reference frequency $f_r$ of 1 megahertz, the phase-locked loop cutoff frequency was established at essentially 1 kilohertz and the minimum value of the mixer input frequency $f_s$ was established at 10 kilohertz. This configuration resulted in suppressing spurious output signals by a minimum of 60 dB (decibels).

Since the pulse incrementor frequency $f_d$ effectively causes perturbations in signal phase within the phase-locked loop, the minimum nonzero value of $f_d$ must also be maintained substantially higher than the loop cutoff frequency $f_{CO}$ in order to provide adequate suppression of spurious output signals. For example, in the realization of the invention wherein the loop cutoff frequency is 1 kilohertz and minimum of 60 dB spurious signal suppression is achieved, a minimum nonzero pulse deletion frequency $f_d$ of 10 kilohertz is utilized.

In situations in which an embodiment of the invention is to provide continuous frequency coverage between a lower frequency limit of $N_1 f_r + f_{d1} + f_{s1}$ and an upper frequency limit of $N_2 f_r + f_{d2} + f_{s2}$, where the numerical subscripts 1 and 2 respectively denote minimum and maximum values of the parameters N, $f_d$ and $f_s$, two other constraints are imposed on the pulse incrementor frequency $f_d$ and the mixer control frequency $f_s$. In particular, if the control increment of $f_s$ is equal to $\Delta f_s$ and the control increment of $f_d$ is equal to $\Delta f_d$, then such continuous frequency coverage requires that $f_{d2} - f_{d1} + \Delta f_d \geq f_r$ and that $f_{s2} - f_{s1} + \Delta f_s \geq \Delta f_d$.

Figure 3:
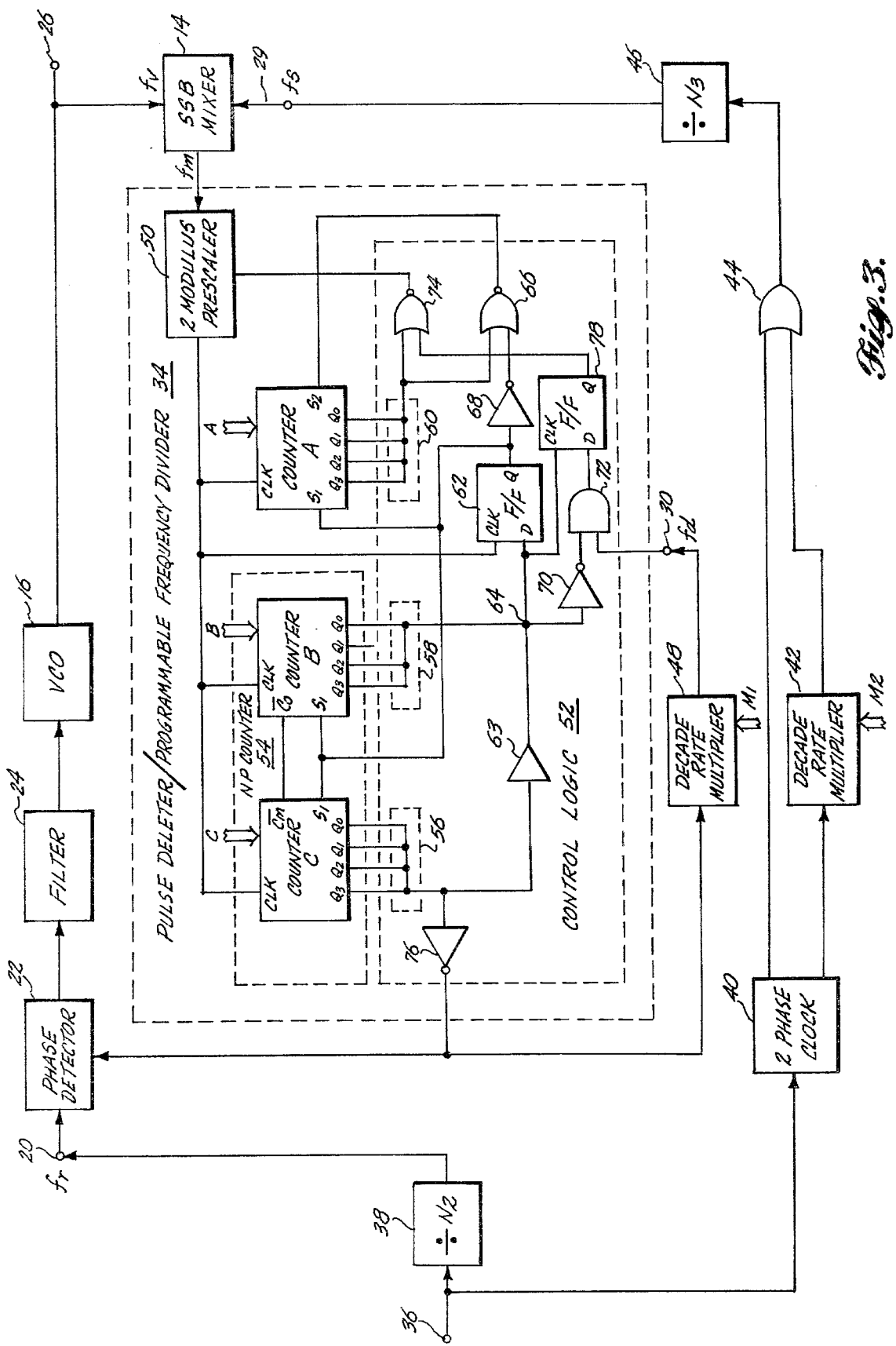
FIG. 3 is a block diagram depicting a detailed embodiment of this invention which employs a combined programmable frequency divider/pulse delector circuit.

The foregoing description and structure and embodiment of the invention depicted in FIG. 1 can be enhanced by considering the embodiment of the invention depicted in FIG. 3. As shall become apparent upon understanding the following description of the circuit of FIG. 3, this embodiment of the invention is arranged to operate in the manner defined by Equation 1 and, in view of the previously described constraints on the control frequencies $f_s$ and $f_d$, to provide continuous frequency coverage over a relatively wide bandwidth with a frequency resolution equal to the control increment of the mixer control frequency $f_s$. In particular, the embodiment of the invention depicted in FIG. 3 is configured for synthesizing a signal in the decimal number system wherein the mixer input frequency $f_s$ controls digits of the output frequency that define several decades of frequency coverage; the pulse deletion frequency $f_d$ controls a group of one or more of the next most significant digits of the output frequency to define a like number of additional decades of frequency coverage; and programmable division is effected to control three additional digits of the output frequency to define three additional decades of frequency coverage.

Comparing FIGS. 1 and 3, in which like elements are denoted by like numerical identifiers, it can be seen that the embodiment of FIG. 3 utilizes a combined pulse deletor and programmable divider circuit (enclosed in the outline 34) to effect operation equivalent to the combined operation of the circuits denoted as a pulse incrementor 12 and a programmable divider 18 in the embodiment of FIG. 1. In this respect, although a conventional programmable divider can be employed with a separate pulse incrementor circuit, such as the hereinafter described pulse deletor of FIG. 5 and the hereinafter described pulse adder circuit of FIG. 7, utilizing a combined deletor/divider such as the deletor/divider 34 of FIG. 3 is often advantageous. In particular, considering present state-of-the-art components, the combined deletor/divider 34 of FIG. 3 is generally capable of higher frequency operation than are other presently known pulse deletor and pulse adder arrangements. Additionally, the combined pulse deletor/programmable divider 34 provides a fully synchronous circuit arrangement which utilizes relatively few circuit components.

In comparing the embodiment of the invention depicted in FIG. 3 with the embodiment depicted in FIG. 1, it can also be noted that the arrangement of FIG. 3 includes additional circuitry for deriving the reference frequency $f_r$ and the mixer input frequency $f_s$ from a single applied signal of frequency $N_2 f_r$, where $N_2$ is a suitable integer. Additionally, in the arrangement of FIG. 3, the pulse deletion frequency $f_d$ is derived from the signal supplied by the combined pulse deletor/programmable divider 34.

More explicitly, in the arrangement of FIG. 3, a relatively stable signal having substantial spectral purity and a frequency of $N_2 f_r$ is supplied to an input terminal 36, divided by the factor $N_2$ within a conventional frequency divider 38 and is supplied to the phase detector 22 as the phase-locked loop reference frequency $f_r$. Additionally, to supply the mixer control frequency $f_s$, the signal at frequency $N_2f_r$ is coupled to a logic circuit that includes a two-phase digital clock 40, a decimal rate multiplier 42, an OR gate 44, and a frequency divider 46. In this arrangement, the two-phase digital clock 40 is conventional circuit which supplies two signals of a frequency identical to the frequency of the applied signal ($N_2f_r$) with the temporal relationship between the two supplied signals being such that each pulse of one of the signals is delayed by one-half a period relative to a corresponding pulse of the other supplied signal. Since one of the signals supplied by the two-phase clock 40 is coupled directly to one input terminal of the OR gate 44, and the second signal supplied by the two-phase clock 40 is coupled to the second input terminal of the OR gate 44 via a conventional decade rate multiplier, it can be recognized that the OR gate 44 supplies a signal having a frequency of $N_2f_r(1+M_2/10^p)$, where p is the number of stages included in the decade rate multiplier 42 and $M_2$ is the rate command signal applied to the decade rate multiplier 42.

More specifically, as is known in the art, a single stage decade rate multiplier is a commercially available logic circuit that supplies a signal at a frequency equal to the frequency of an applied signal multiplied by a rate command M and divided by the factor 10. In particular, the rate command M is supplied to the decade rate multiplier as a parallel format, binary encoded signal representative of the numbers 0, 1, 2, ..., 9. Such a signal is often supplied, for example, by a conventional digital latch circuit or storage register (not depicted in FIG. 3). Accordingly, depending on the decimal value of the binary encoded rate command signal M, a single stage rate multiplier supplies a signal frequency of 0, $0.1f_i$, $0.2f_i$, ..., $0.9f_i$ where $f_i$ is the frequency of the signal supplied to the decade rate multiplier.

Advantageously, single stage decade rate multipliers can be arranged in cascade to supply several decades of frequency conditioning, i.e., n single stage decade rate multipliers can be cascaded to supply an output frequency of 0, $f_i/10^n$, $2f_i/10^n$, ..., $(9\times10^{(n-1)}+9\times10^{(n-2)}+ \ldots +9)f_i/10^n$. For example, when four single stage decade rate multipliers are cascaded to effect four decade rate multiplication, the rate input signal can be set at integer values between 0 and 9999 to provide a single frequency ranging between 0 and $0.9999$ times the frequency $f_i$ of the applied signal, in steps of $0.0001f_i$.

Since the signal supplied by the decade rate multiplier 42 can never be in time coincidence with the supplied directly to the OR gate 44 by the two-phase clock 40, the OR gate 44 effectively adds the signal pulses supplied by the decade rate multiplier 42 to the signals supplied directly to the OR gate 44 by the two-phase clock 40. Accordingly, a signal at the previously mentioned frequency of $N_2f_r(1+M_2/10^p)$ is supplied by the OR gate 44. The signal frequency is then divided by the factor $N_3$ within the frequency divider 46 and supplied to the terminal 28 of the single sideband mixer as the mixer control frequency $f_s$.

In the practice of this invention, it is advantageous to arrange the circuit such that $N_3$ is a relativey large number. This consideration arises since a typical decade rate multiplier does not necessarily supply a signal having equal spacing between adjacent signal pulses. Thus, signal perturbations can be caused in the phase-locked loop that can, in turn, cause spurious output signals. By utilizing a large divisor $N_3$ in the frequency divider 46, these signal perturbations are minimized and spurious output signals are maintained at generally acceptable levels.

For example, in the previously mentioned implementation of FIG. 3, the signal frequency $N_2f_r$ is established at 10 megahertz, a four decade rate multiplier is utilized as the decade rate multiplier 42, and $N_3$ of the frequency divider 46 is established at 1,000. Thus, in this particular circuit, a mixer control frequency $f_s$, which ranges between 10 kilohertz and 19.999 kilohertz, can be established, depending upon the applied rate command signal $M_2$. It should be noted that the minimum frequency of the mixer control frequency $f_s$ is $N_2f_r/N_3$ (when $M_2=0$). As previously described, this minimum frequency is established substantially higher then the cutoff frequency of the phase-locked loop to thereby suppress spurious signal generation.

With continued reference to FIG. 3, the pulse deletion frequency $f_d$ can be conveniently supplied to the pulse incrementor control terminal 30 by a second decade rate multiplier 48, connected to receive the signal pulses supplied by the combined pulse deletor/programmable divider 34. In understanding the operaton of this portion of the circuit arrangement of FIG. 3, it should be recalled that when the phase-locked loop is synchronized, the frequency of the signal supplied to the phase detector 22 (e.g., the signal supplied by the combined pulse deletor/programmable divider 34 of FIG. 3) is substantially equal to the phase-locked loop reference frequency $f_r$. Thus, in many situations, a suitable input signal for the decade rate multiplier 48 can be obtained from the phase-locked loop reference signal, i.e., the output of the frequency divider 38, or can alternatively be provided by the signal supplied by the deletor/divider 34. In this respect, it is presently believed advantageous to connect the decade rate multiplier 48 to the output signal supplied by the deletor/divider 34 (as shown in FIG. 3), since fully synchronous operation of the deletor/divider 34 is thereby ensured. In particular, as shall be described in more detail hereinafter, the pulse deletor/programmable divider 34 operates with a particular timing sequence in which the pulse deletion signal supplied to terminal 30 is, in effect, periodically sampled. In this respect, deriving the pulse deletion frequency $f_d$ from the periodic signal pulses supplied by the pulse deletor/programmable divider 34 causes each particular pulse deletion signal to be coupled to the terminal of the pulse deletor/programmable divider 34 at an appropriate moment of time.

Regardless of the exact manner in which the decade rate multiplier 48 is connected to receive a signal at the frequency $f_r$, it can be recognized that the decade rate multiplier 48 supplies a pulse deletion signal at a frequency $f_d$ equal to $f_rM_1/10^m$ to the pulse incrementor input terminal 30, where $M_1$ is the rate command signal applied to the decade rate multiplier 48 and the exponent m is the number of stages included in the decade rate multiplier 48. As previously indicated, m is also identically equal to the number of digits of the output frequency that are controlled with the pulse deletion frequency $f_d$. For example, in the previously mentioned implementation of the embodiment of FIG. 3, in which the mixer input frequency $f_s$ controls those digits of the system output frequency corresponding to kilohertz, hundreds of hertz, tens of hertz, and hertz, a reference frequency $f_r$ of one megacycle is utilized and a two-decade rate multiplier is employed as the decade rate multiplier 48 so that the pulse deletion frequency $f_d$ controls those digits of the output frequency corresponding to hundreds of kilohertz and tens of kilohertz.

With continued reference to FIG. 3, the combined pulse deletor/programmable divider 34 includes a conventional two-modulus prescaler 50; three conventional decade counters, identified as counter C, counter B and counter A; and control logic 52 which controls the operation of the prescaler 50 and the counters A, B and C to effect division of the signal supplied by the single sideband mixer by a selectable three decade divisor, i.e., $C \times 100 + B \times 10 + A$, where A, B and C are integers between 0 and 9, and to simultaneously effect pulse deletion at the pulse deletion frequency $f_d$, where $f_d$ is the frequency of the signal supplied to the terminal 30 by the decade rate multiplier 48.

In the depicted arrangement, the control logic 52 supplies a control signal to the two-modulus prescaler 50 which causes the prescaler 50 to supply one output pulse for each group of ten consecutive signal pulses supplied by the single sideband mixer 14 (operation in modulus ten) or causes the prescaler 50 to supply one output pulse for each grup of eleven consecutive signal pulses supplied by the single sideband mixer 14 (operation in modulus eleven). During operation of the arrangement depicted in FIG. 3, counters C and B (collectively identified as the $N_p$ counter 54 in FIG. 3) are periodically preset or programmed to a count of $N_p = C \times 10 + B$, where C and B respectively denote binary encoded signals corresponding to the digits 0 through 9 that are supplied to the counters C and B by conventional apparatus such as digital latch circuits (not shown in FIG. 3). Both counters B and C are clocked by the signals supplied by the two-modulus prescaler 50 to supply a single output pulse to the phase detector 22 and the decade rate multiplier 48 each time the $N_p$ counter 54 is decremented from the count of $N_p$ to a count of 1. Thus, in effect, the $N_p$ counter 54 supplies one output pulse for each series of $N_p$ signal pulses supplied by the two-modulus prescaler 50 where each prescaler signal pulse corresponds to a group of either ten or eleven consecutive signal pulses supplied by the single sideband mixer 14.

In particular, during each counting cycle in which $N_p$ signal pulses are supplied by the two-modulus prescaler 50, the control logic 52 causes the prescaler 50 to supply the first signal pulse of the counting cycle in response to the first group of eleven consecutive signal pulses supplied by the single sideband mixer 14 if a pulse deletion signal is present at the terminal 30, or causes the prescaler 50 to supply a first signal pulse in response to the first group of ten consecutive signal pulses supplied by the single sideband mixer 14 if a pulse deletion signal is not present at the terminal 30. During the next portion of the counting cycle, the control logic 52 and the counter A cause the two-modulus prescaler 50 to supply the next A prescaler pulses such that each signal pulse supplied by the prescaler 50 corresponds to a group of eleven consecutive signal pulses supplied by the single sideband mixer 14. Throughout the remaining portion of each counting cycle, the control logic 52 causes the two-modulus prescaler 50 to operate with modulus ten, such that a signal pulse is provided by the two-modulus prescaler 50 for each group of ten consecutive signal pulses supplied by the single sideband mixer 14. Thus, for each counting cycle of the embodiment of FIG 3 in which a pulse deletion signal is not present at the terminal 30, the pulse deletor/programmable divider 34 supplies a single output pulse in response to 10 $N_p + A$ signal pulses of the single sideband mixer 14. On the other hand, when a pulse deletion signal is present at the terminal 30, the pulse deletor/programmable divider 34 supplies a single output pulse in response to 10 $N_p + A + 1$ signal pulses of the single sideband mixer 14. When the operation of the pulse deletor/programmable divider 34 is considered over a time period that encompasses a sufficient number of counting cycles, it can be shown that when the average frequency of the signal supplied by the pulse deletor/programmable divider 34 equals the reference frequency $f_r$, i.e., the phase-locked loop is in the locked condition, then the mixer 14 supplies signal pulses at the frequency $f_m = f_r(10N_p + A) + f_d$. Since the frequency of signal supplied by the single sideband mixer 14 is equal to $f_v - f_s$, it can accordingly be shown that the VCO 16 supplies an output signal to the terminal 26 at a frequency of $f_v = f_r(10N_p + A) + f_d + f_s$.

For example, recalling that the decade rate multiplier 48 of the embodiment of FIG. 3 supplies a signal frequency $f_d$ of $f_r M_1/10^m$, it can be recognized that the decade rate multiplier 48 supplies $M_1 f_r$ signal pulses to the terminal 30 during a time period corresponding to $10^m$ counting cycles of the $N_p$ counter 54. Since the phase-locked loop will synchronize or lock when the signal supplied by the pulse deletor/programmable divider 34 is identical to the reference frequency $f_r$, it can be shown that as long as the phase-locked loop is in the locked condition, the average frequency of the signal supplied by the signal sideband mixer 14 is $$f_m = f_r(10N_p + A + M_1/10^m).$$

When a decade rate multiplier 42 for effecting four decades of rate multiplication and a decade rate multiplier 48 for effecting two decades of rate multiplication are employed in the circuit of FIG. 3, with $N_2/N_3$ being established equal to $10^{-2}$, it can be shown that the frequency supplied to the system output terminal 26, i.e., the signal frequency supplied by the VCO 16 is $$f_o = f_r(100C + 10B + A) + f_r(M_{11}/10 + M_{12}/10^2) + f_r(10^{-2} + M_{21}/10^3 + M_{22}/10^4 + M_{23}/10^5 + M_{24}10^6)$$

where the rate command signal $M_1$ is represented by the coefficients $M_{1i}$, $i = 1, 2$ which represent the equivalent decimal values of the binary encoded signals supplied to the two stages of rate multiplier 48 and the coefficients $M_{2j}$, $j = 1,2,3,4$ represent the equivalent decimal values of the binary encoded signals supplied to the four stages of the decade rate multiplier 42.

Thus, in the particular arrangement, a nine digit output frequency can be synthesized over the frequency decades of $100f_r$ to $10^{-6}f_r$, with each of the control parameters A, B, C, $M_{1i}$ and $M_{2j}$ controlling one digit (or frequency decade) of the output frequency. With respect to the previously mentioned implementation of the embodiment of FIG. 3, wherein $f_r$ is equal to one megahertz, the programmable divisor coefficients C, B and A thus control digits of the output frequency corresponding to hundreds of megahertz, tens of megahertz and megahertz; the two rate multiplier input coefficients of the rate multiplier 48, which establish the frequency $f_d$ control the hundred kilohertz and ten kilohertz digits; and the four rate input coefficients of rate multiplier 42 control digits of the output frequency corresponding to kilohertz, hundreds of hertz, tens of hertz and hertz.

It should be noted that the output frequency range of each embodiment of the invention is limited primarily by the range of the VCO 16 and frequency limitations of the individual circuit stages, e.g., the single sideband mixer 14 and the two-modulus prescaler 50. In this respect, presently available digital circuits permit operation of the invention well into the hundreds of megahertz range, with an output bandwidth of at least one frequency octave. Accordingly, arrangements of the invention are often useful as an octave wide signal source for use with successive multiply-by-2, successive divide-by-2, or heterodyning techniques for synthesizing an output signal over a multiple octave bandwidth.

Turning now to a more detailed discussion of the arrangement of FIG. 3, sequential operation of the depicted synthesizer system will be described wherein, during each counting cycle of the $N_p$ counter 54, the control logic 52 is caused to: (1) generate a single pulse signal that is supplied to the phase detector 22 for locking the system to the desired output frequency; (2) initialize counters C, B, and A at the beginning of each counting cycle in accordance with the desired output frequency; (3) control the operation of the two-modulus prescaler 50 during a first portion of each counting cycle to effect pulse deletion; and, (4) control the operation of the two-modulus prescaler during the remaining portion of each counting cycle, such that the pulse deletor/programmable divider 34 effects frequency division of the signal supplied by the single sideband mixer 14 by a factor of $100C + 10B + A$, where C, B, and A are the frequency programming signals respectively supplied to the counters C, B, and A.

In the arrangement of FIG. 3, counters C and B are conventional decade counting circuits that can be preset to a desired count by the programming commands B and C, whenever a logically low signal (i.e., a logical 0) is coupled to the counter set terminals $S_1$ and decremented each time a signal pulse (e.g., a positive signal transition between a logically low level and a logically high level) is coupled to a counter clock terminal (CLK). In particular, the counters C and B of FIG. 3 are interconnected to count over a two decade range ($10C+B$) by interconnection of a carry output terminal ($\overline{C_o}$) of counter B with a carry input ($\overline{C_{in}}$) of counter C. In this arrangement, counter B supplies a carry pulse to the $\overline{C_{in}}$ terminal of counter C each time counter B is decremented to a count of zero to thereby decrement counter C on the arrival of the next clock pulse. Thus, during each counting cycle, the signal pulses supplied by the two-modulus prescaler 50 cause counter B to continuously cycle from a count of nine to zero with counter C being decremented by one count each time counter B cycles through the count of 0. Accordingly, when counter C reaches a count of zero and counter B again counts down from nine to one, $N_p = 10C + B$ signal pulses have been supplied by the two-modulus prescaler 50.

Counter A of the embodiment of FIG. 3 is also a conventional decade counting circuit of the variety that is decremented from a preset value to a count of zero by clock pulses that are coupled to the counter CLK terminal. Additionally, to permit counter A to be activated only over a specific portion of each counting cycle of $N_p$ prescaler pulses in the hereinafter described manner, counter A is of the type in which control signals selectively enable or disable the counter. Various counting circuits of this type are known in the art and can be utilized in the practice of this invention by suitably configuring control logic 52. For example, counter A of the arrangement of FIG. 3 can be a universal decade counter, such as the integrated circuit manufactured by the Motorola Corporation and identified as the MC10137. Such a counter circuit is controlled by logic signals applied to control terminals (denoted as $S_1$ and $S_2$) such that the counter operates in a count-up mode when the $S_1$ terminal is logically low and the $S_2$ terminal is logically high; operates in a count-down mode when the $S_1$ terminal is logically high and the $S_2$ terminal is logically low; presets to the value of an applied programming signal when the $S_1$ terminal and the $S_2$ terminals are both logically low; or operates in a hold mode, i.e., stops counting, when the $S_1$ and $S_2$ terminals are both logically high.

The operating mode of counter A and the presetting of counters C and B are controlled by logic circuitry within control logic 52 that detects the end of each counting cycle of $N_p$ prescaler pulses and detects the decrementing of the counter A to a count of zero. In particular, the output terminals of counters C, B and A are interconnected to form "hard-wired" OR circuits respectively enclosed within the dashed outlines 56, 58 and 60 of FIG. 3. Since the logical OR circuits 56 and 60 respectively interconnect the $Q_0$, $Q_1$, $Q_2$ and $Q_3$ output terminals of counters C and A, it can be recognized that the logical OR circuits 56 and 60 will supply a logical 0 signal only when the respective counters contain a count of zero. On the other hand, since the logical OR circuit 58 interconnects the $Q_0$, $Q_2$ and $Q_3$ output terminals of counter B, but does not include the $Q_1$ output, it can be recognized that OR circuit 58 supplies a logical 0 whenever the counter B contains a count of two or contains a count of zero.

To supply the preset or $S_1$ signal to each of the counters C, B and A, the output signal of the OR circuit 56 (supplied via an isolation stage or buffer amplifier 63) and the output signal of the OR circuit 58 are commonly connected to the D input terminal of a conventional-type D flip-flop 62, with the flip-flop 62 being connected for receiving clock pulses from the two-modulus prescaler 50. Since the physical interconnection of the output terminals of the OR circuits 56 and 58 (at interconnection 64, FIG. 3) effectively forms an additional hardwired logical OR circuit, it can be noted that the D input terminal of the flip-flop 62 receives a logical 0 signal only when counter C contains a count of zero and counter B contains a count of two or zero. Thus, the signal applied to the D input of flip-flop 62 remains at a logical 1 level until the next-to-the-last prescaler pulse of each counting cycle. When the last signal pulse of each counting cycle is supplied by the two-modulus prescaler 50, the Q output of flip-flop 62 (which is connected to the $S_1$ terminals of the counters C, B and A) changes states from a logical 1 to a logical 0 to thereby preset counters C and B with the desired frequency programming.

To simultaneously preset counter A to a value appropriate to the currently programmed output frequency, the $S_2$ terminal of counter A must be logically low as the last pulse of the counting cycle is supplied by the two-modulus prescaler 50. To accomplish this, the $S_2$ signal is supplied to counter A by a two-input NOR gate 66 having one input terminal connected for receiving the signal supplied by the hard-wired OR circuit 60 and the second input terminal connected for receiving the Q output of flip-flop 62 via a conventional inverter circuit 68. Since, as previously indicated, the Q output of flip-flop 62 goes to a logical 0 as the last signal pulse of a counting cycle is supplied by the two-modulus prescaler, a logical 1 signal is supplied to the NOR gate 66. Accordingly, NOR gate 66 supplies a logical 0 to the $S_2$ terminal of counter A and since the $S_1$ signal is also at logical 0 during this time, counter A is preset with a supplied programming signal concomitantly with the presetting of counters C and B.

Thus, with the arrival of the first pulse of the next counting cycle, each counter C, B and A holds a count corresponding to the currently programmed output frequency and flip-flop 62 sets the $S_1$ signal of each counter at a logical 1 to begin a new counting cycle.

During the first portion of the counting cycle, the modulus of the two-modulus prescaler 50 is controlled to effect pulse deletion by the operation of a conventional inverter circuit 70, a conventional two-input AND gate 72, a conventional two-input NOR gate 74 and a conventional flip-flop 78. In the arrangement depicted in FIG. 3, the signal supplied by the hard-wired OR logic 56 is coupled to one input terminal of the AND gate 72 via the inverter 70 and the second input terminal of the AND gate 72 receives the pulse deletion signal supplied by the decade rate multiplier 48 via the terminal 30. Thus, the AND gate 72 supplies a logical 1 signal to the D input terminal of flip-flop 78 only if counter C contains a count of zero, the counter B contains a count of two and the pulse deletion signal supplied by the decade rate multiplier 48 is at a level corresponding to a logical 1. Since the CLK terminal of the flip-flop 78 is connected to the OR logic interconnection 64, the Q output of flip-flop 78 will supply a logical 1 signal to one input terminal of the NOR gate 74 as the counter B decrements to a count of one. Since the second input terminal of the NOR gate 74 is connected for receiving the signal supplied by the hard-wired OR logic 60, it can observed that the NOR gate 74 supplies a logical 1 signal to the modulus control terminal of the two-modulus prescaler 50 only when counter A contains a count of zero and flip-flop 78 concurrently supplies a logical 0 signal, i.e., counters C and B respectively, contain a count of zero and one while the level of the pulse deletion signal supplied by decade rate multiplier 48 corresponds to a logical 1.

As previously described, the two-modulus prescaler 50 of FIG. 3 is of the type that can be interconnected to selectively divide an incoming signal frequency by a factor of ten during time intervals in which a logical 1 signal is applied to a control terminal of the two-modulus prescaler 50 and divide the frequency of the incoming signal by a factor of eleven when a logical 0 is supplied to the control terminal (e.g., the integrated circuit manufactured by Motorola Corporation and identified as the MC12013 two-modulus prescaler). Further, as previously mentioned, when the modulus of the prescaler is to be changed, the appropriate control signal must be supplied at least a predetermined time prior to the end of the nextmost antecedent count or cycle of the two-modulus prescaler. Thus, with respect to the embodiment of FIG. 3, the modulus of the prescaler 50 during the first portion of each counting cycle to effect pulse deletion is actually determined during the time period in which the two-modulus prescaler 50 supplies the last signal pulse of the nextmost antecedent counting cycle. As shall be described relative to the timing diagram of FIG. 4, counter A is in the hold state and contains a count of zero during the final $N_p - A - 1$ prescaler pulses of each counting cycle and counter C contains a count of zero during the time period in which the prescaler 50 supplies the final nine prescaler pulses of each counting cycle. Thus, during the time interval in which the two-modulus prescaler 50 supplies the final pulse of each counting cycle, the hard-wired OR logic 60 supplies a logical 0 to one input terminal of the NOR gate 74 and the inverter 70 supplies a logical 1 signal to one input terminal of the AND gate 72. Accordingly, if the signal level of the pulse deletion signal supplied by the decade rate multiplier 48 corresponds to a logical 1 during this time period, the AND gate 72 will supply a logical 1 signal to the second input terminal of the NOR gate 74 (via flip-flop 78) to thereby cause the NOR gate 74 to supply a logical 0 and set the modulus of the two-modulus prescaler 50 equal to eleven. On the other hand, if the level of the signal supplied by the decade rate multiplier 48 corresponds to a logical 0 during the final prescaler pulse of a particular counting cycle, a logical 0 will be supplied to the NOR gate 74, which, in turn, supplies a logical 1 to set the modulus of the two-modulus prescaler equal to ten during the time interval in which the two-modulus prescaler supplies the first prescaler pulse of the next counting cycle. Thus, depending on the signal conditions during the terminal portion of each counting cycle, the first prescaler pulse of the next counting cycle will either correspond to ten or eleven signal pulses of the signal supplied by the single sideband mixer 14. As previously described, if eleven mixer signal pulses are required to generate the first prescaler pulse (rather than ten), one signal pulse of the signal supplied by the single sideband mixer 14 is effectively deleted.

Following the generation of the initial prescaler signal pulse of each counting cycle, the positive transition (leading edge) of each signal pulse supplied by the prescaler 50 decrements counters C, B and A by one count. During this operation, and until counter A contains a count of zero, the NOR gate 74 supplies a logical 0 signal to the two-modulus prescaler 50 to set the prescaler modulus equal to eleven. In particular, since, as previously described, the signal at the interconnection 64 is a logical 1 until the next-to-last prescaler pulse of each counting cycle, the signal supplied to one input terminal of the NOR gate 74 by the AND gate 72 remains at logical 0 until the next-to-last signal pulse of the counting cycle is supplied by the prescaler 50. Further, during the time interval in which the first A pulses of a counting cycle are being supplied by the two-modulus prescaler 50, counter A is being decremented from a count of A to a count of zero and the hard-wired OR logic 60 accordingly supplied a logical 0 to the second input terminal of the NOR gate 74 to operate the two-modulus prescaler 50 with a modulus of eleven.

When counter A reaches a count of zero, the NOR gate 74 supplies a logical 0 to the two-modulus prescaler 50 to set the prescaler modulus equal to ten. Since counter A, attaining a count of 0, also causes the NOR gate 66 to supply a logical 1 to the $S_2$ terminal of counter A, counter A enters a hold state and remains at count of zero throughout the remaining portion of the counting cycle. With the counter A containing a count of 0, NOR gate 74 supplies a logical 1 to the two-modulus prescaler 50 until the final prescaler pulse of the counting cycle and the two-modulus prescaler 50 thus operates with modulus ten until the beginning of the next counting cycle (i.e., the next time interval in which the pulse deletion signal determines the prescaler modulus). Accordingly, it can be seen that, as previously mentioned, the single sideband mixer 14 supplies $N_p+A+1$ signal pulses during a counting cycle in which a pulse deletion signal is present at the terminal 30 and supplies $N_p+A$ signal pulses during a counting cycle in which a pulse deletion is not supplied to the terminal 30.

In addition to supplying a logic signal for detecting the conclusion of each counting cycle, the hard-wired OR logic 56 supplies a single positive signal pulse to the phase detector 22 and the decade rate multiplier 48 during the terminal portion of each counting cycle. More explicitly, the pulse deletor/programmable divider 34 of FIG. 3 includes a conventional inverter circuit 76 having the input terminal connected to the hard-wired OR logic 56 and the output terminal commonly connected to one input of the phase detector 22 and input terminal of the decade rate multiplier 48. Since the OR logic 56 supplies a logical 1 signal during an initial portion of each counting cycle and supplies a logical 0 during the time period in which counter B is decremented by the final nine prescaler pulses of each counting cycle, it can be recognized that the inverter 76 supplies a positive signal pulse of a width corresponding to the timer interval in which the prescaler 50 generates the last nine prescaler pulses. Since, as previously described, the two-modulus prescaler 50 operates with modulus ten during this portion of a counting cycle, the time deviation of the positive signal pulse supplied by the inverter 76 also corresponds to the time interval in which the single sideband mixer 14 supplies the final 90 signal pulses of the counting cycle.

Since the input signal of the decade rate multiplier 48 is provided by the inverter 76, it can be recognized that, if the rate signal $M_1$ of the decade rate multiplier 48 is such that that particular signal pulse causes the decade rate multiplier 48 to supply a positive signal pulse to the terminal 30, the positive signal will be present at the terminal 30 during the time interval in which the two-modulus prescaler 50 supplies the final prescaler pulse of the counting cycle. With a positive signal at terminal 30, control logic 52 will cause the two-modulus prescaler 50 to operate with modulus eleven during the time period in which the first prescaler pulse of the next counting cycle is being supplied. As previously described, operation with modulus eleven during the first portion of a counting cycle effectively deletes a signal pulse of the signal supplied by the single sideband mixer 14.

Figure 4:
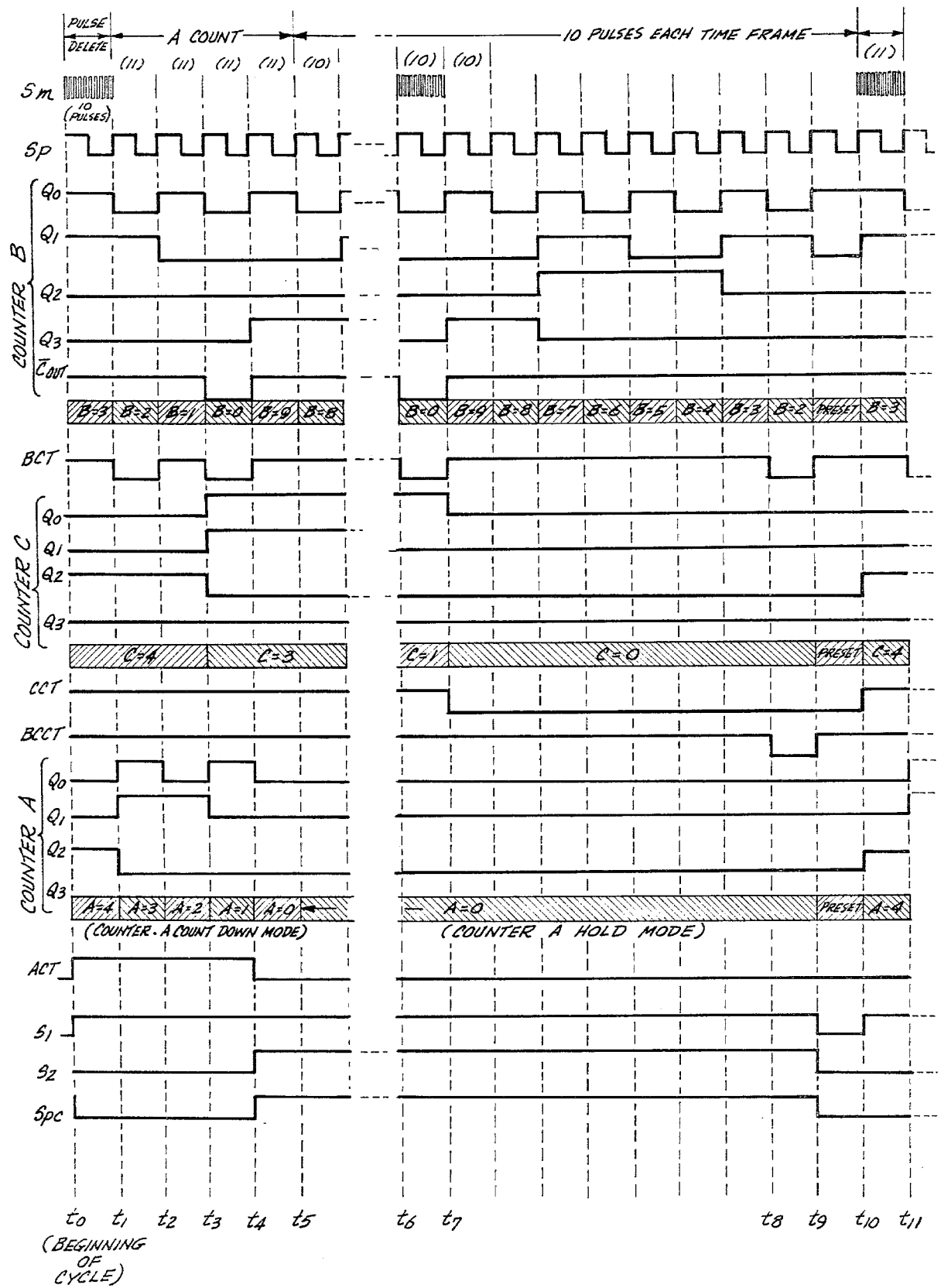
FIG. 4 is a timing diagram useful in understanding the operation of the embodiment of the invention in FIG. 3.

The above description of the operation of the embodiment of FIG. 3 is exemplified by the timing diagram of FIG. 4, in which counters C and A are programmed with the digit 4 and counter B is programmed with the digit 3 to provide an output frequency of 434 megahertz. As previously described, the pulse deletion frequency $f_d$ and the mixer control frequency $f_s$ determine those digits of the output frequency between one hundreds of kilohertz and hertz. Accordingly, with counters C, B and A programmed to provide an output frequency of 434 megahertz, $f_d$ and $f_s$ can be respectively programmed by controlling the rate signals $M_1$ and $M_2$ of the decade rate multipliers 48 and 42 to cause the circuit arrangement to supply an output frequency between 434.000000 and 434.999999 megahertz, with a frequency control increment of 1 hertz.

In the counting cycle depicted between times $t_0$ and $t_{10}$ in FIG. 4, it is arbitrarily assumed that the decade rate multiplier did not supply a positive pulse deletion signal to the terminal 30 prior to the time $t_0$, i.e., during the terminal portion of the next most antecedent counting cycle. Accordingly, the two-modulus prescaler 50 operates with modulus ten, while the prescaler 50 supplies the first prescaler pulse signal (signal $S_p$ in FIG. 4) in response to the first ten signal pulses supplied by the single sideband mixer 14 (signal $S_m$ in FIG. 4). Thus, the period of the first signal pulse of the prescaler signal $S_p$ corresponds to ten periods of the single sideband mixer signal $S_m$ and, at time $t_1$ of FIG. 4, the prescaler signal $S_p$ goes positive. Since the counter control signal $S_1$ is a logical 1 and the counter control $S_2$ is a logical 0 during the time $t_0$ to $t_1$, counters B and A are decremented at time $t_1$ to a count of 2 and 3, respectively. Since counter B does not supply a carry signal $\overline{C_o}$ until counter B reaches a count of 0, counter C remains at a count of 4. With counter A holding a count of 4 during the time interval $t_0$ to $t_1$, the OR logic 60 causes the NOR gate 74 to supply a logical 0 to the prescaler 50 signal $S_{pc}$ in FIG. 4) to thereby set the modulus of the two-modulus prescaler 50 equal to eleven following the generation of the first prescaler pulse at time $t_1$.

During the time period $t_1$ to $t_2$ in which the next eleven pulses of the single sideband mixer signal $S_m$ cause the prescaler 50 to supply the second signal pulse of the $S_p$ signal, counter B contains a count of two and the OR logic 58 supplies a logical 0 (signal BCT in FIG. 4). However, since counter C does not contain a count of zero during this time interval, OR logic 56 and the signal supplied by the logical OR interconnection 64 of FIG. 3 both remain at logic level 1 (signals CCT and BCCT, respectively, in FIG. 4). Accordingly, the Q output of flip-flop 62 (signal $S_1$) and the output of the NOR gate 66 (signal $S_2$) respectively remain at logic levels 1 and 0 so that the next positive signal transition of the $S_p$ at time $t_2$ causes counter B to decrement to a count of one and counter A to decrement to a count of two.

Since the A counter contained a count of two in the time interval $t_1$ to $t_2$, the signal ACT (supplied by OR logic 60) is a logical 1 to cause the NOR gate 74 to supply the modulus control signal $S_{pc}$ at logic level 0. Accordingly, the two-modulus prescaler 50 operates with modulus eleven after time $t_2$ and the next group of eleven signal pulses of the single sideband mixer signal $S_m$ cause the two-modulus prescaler 50 to generate the third signal pulse of the prescaler signal $S_p$. In synchronization with the positive signal transition that ends the third prescaler pulse (at time $t_3$), counter A is decremented to a count of one and counter B is decremented to a count of zero. Since counter B now contains a count of zero, the carry signal $\overline{C_o}$ goes to a logical 0 to effectively arm the counter C such that counter C will be decremented upon the arrival of the next positive transition of the prescaler signal $S_p$. Although the signal BCT, supplied by the OR logic 58, goes to a logical 0 at time $t_3$, the logical OR interconnection 64 continues to supply the BCCT signal at logic level 1, since the CCT signal (supplied by the OR logic 56) is a logical 1. Accordingly, flip-flop 62 does not change states to alter the logic levels of the counter control signals $S_1$ and $S_2$ and counter A continues to operate in a count-down mode.

Since counter A contained a count of two during the time interval $t_2$ to $t_3$, the ACT signal (supplied by the OR logic 60) remains at logic level 1 to thereby cause the modulus control signal $S_{pc}$ (supplied by the NOR gate 74) to remain at logic level 0. Thus, the modulus of the two-modulus prescaler 50 is maintained at eleven and the fourth signal pulse of the prescaler signal $S_p$ (time interval $t_3$-$t_4$) corresponds to the next group of eleven signal pulses of the single sideband mixer signal $S_m$. With the positive signal transition of the prescaler signal $S_p$ at time $t_4$, counter A is decremented to a count of zero, counter C is decremented to a count of three and counter B decrements to a count of nine. It should be noted that the attainment of a zero count by counter A at time $t_4$ causes the counter control signal $S_2$ (supplied by the OR gate 66) to change from a logical 0 to a logical 1. Since, following time $t_4$, both counter control signals $S_1$ and $S_2$ are at logic level 1, counter A enters the hold state and remains at a count of 0 until the logic level of the $S_1$ and/or the $S_2$ signal changes.

During the time interval $t_3$ to $t_4$, the modulus control signal $S_{pc}$ (supplied by the NOR gate 74) remains at logic level 0. Accordingly, the two-modulus prescaler 50 operates with modulus eleven following time $t_4$ such that the next group of eleven signal pulses of the single sideband mixer signal $S_m$ cause the two-modulus prescaler 50 to supply the fifth signal pulse of the prescaler signal $S_p$ (time interval $t_4$ to $t_5$ in FIG. 4). With the positive transition that marks the end of the fifth signal pulse of the prescaler signal $S_p$ (at time $t_5$), counter B is decremented to a count of eight. Since, as previously described, counter A is in the hold state, counter A remains at a count of zero.

It should be noted that, as counter A reaches a count of 0 at time $t_4$, the signal BCCT, which is supplied by the logical OR interconnection 64 of FIG. 3 to one input terminal of the AND gate 72 via the inverter circuit 70, remains a logical 1 and thus causes AND gate 72 to supply a logical 0 to the D input terminal of the flip-flop 78. Thus, flip-flop 78 continues to supply a logic 0 to one input terminal of NOR gate 74. Since attainment of a count of A equal to zero causes the ACT signal (supplied by OR logic 60 to the second input terminal of NOR gate 74) to become a logical 0, the modulus control signal $S_{pc}$ (supplied by the NOR gate 74) becomes a logical 1 at time $t_4$. Accordingly, following time $t_5$ of FIG. 4, the two-modulus prescaler 50 will operate with modulus ten such that the sixth signal pulse of the prescaler signal $S_p$ corresponds to ten signal pulses of the single sideband mixer signal $S_m$. In this respect, it should be recognized that since counter A enters the hold state at time $t_4$ and the OR interconnection 64 continues to supply a logical 1 signal until counter C decrements to 0 and counter B simultaneously reaches a count of two, the modulus control signal $S_{pc}$ will remain at logic level 1 until the last signal pulse of the prescaler signal $S_p$.

Thus, following time $t_5$ in FIG. 4, the two-modulus prescaler 50 continues to supply one signal pulse of the $S_p$ signal in response to each group of ten signal pulses of the single sideband mixer signal $S_m$, with each signal pulse of the prescaler signal $S_p$ decrementing counter B and every tenth signal pulse of the prescaler signal $S_p$ decrementing counter C. Counting the signal pulses of the $S_p$ signal in this manner, the arrangement of FIG. 3 reaches the signal state identified at $t_6$ in FIG. 4 wherein counter C contains a count of 1, counter B contains a count of 0 and counter A, still remaining in the hold state, contains a count of 0. Since counter B reaches a count of 0 at time $t_6$ counter B supplies a carry-out pulse $\overline{C_o}$ (logic level 0) to the carry input of counter C. Although counter B, attaining a count of zero at time $t_6$, also causes the BCT signal (supplied by OR logic 58) to become a logical 0, the BCCT (supplied by the logical OR interconnection 64) remains a logical 1 such that the two-modulus prescaler 50 continues to operate with modulus ten (signal $S_{pc}$ at logic level 1) following time $t_6$. Thus, the two-modulus prescaler 50 supplies the next signal pulse of the prescaler signal $S_p$ in response to the next group of ten signal pulses of the single sideband mixer signal $S_m$ (time interval $t_6$ to $t_7$ of FIG. 4). As this signal pulse ends at time $t_7$, the positive transition of the prescaler signal $S_p$ causes counter C to decrement to a value of 0 and counter B to decrement to a count of 9. Since counter C contains a count of 0 subsequent to time $t_7$, the CCT signal, supplied by OR logic 56, becomes a logical 0.

With the modulus control signal $S_{pc}$ remaining at logic level 1, the next seventy signal pulses of the single sideband mixer signal $S_m$ cause the two-modulus prescaler 50 to supply seven signal pulses of the prescaler signal $S_p$ to thereby decrement counter B from a count of nine to a count of two (time interval $t_7$ to $t_8$ in FIG. 4). When counter B reaches a count of two at time $t_8$, OR logic 58 causes the BCT signal to become a logical 0. Since OR logic 56 also supplies the CCT signal at logic level 0 (counter C at a count of zero), the logic level at the logical OR interconnection 64 (BCCT signal) becomes a logical 0. Thus, at time $t_9$, the two-modulus prescaler 50 (continuing to operate with modulus 10) completes the next signal pulse of the prescaler signal $S_p$ in response to the next group of ten signal pulses of the single sideband mixer signal $S_m$ and the flip-flop 62 changes states to cause both counter control signals $S_1$ and $S_2$ to become a logical 0.

As previously described, supplying counters C and B with a $S_1$ signal at logic level 0 causes counters C and B to preset to the value of the applied programming commands (denoted by the double arrows C and B in FIG. 3) and supplying counter A with both a $S_1$ and a $S_2$ signal at a logic level 0 causes counter A to preset to the value of the applied programming command A. Thus, when the two-modulus prescaler 50 completes the next signal pulse of the prescaler signal $S_p$ (at time $t_{10}$) the counters C, B and A are reprogrammed to begin the next counting cycle of $N_p$ pulses of the prescaler signal $S_p$. In FIG. 4 it is assumed that the frequency synthesizer of FIG. 3 was not programmed to alter the hundreds of megahertz, tens of megahertz or megahertz digits of the output frequency during the depicted counting cycle. Accordingly, at time $t_{10}$, counter C contains a count of 4, counter B contains a count of 3 and counter A contains a count of 4. If the synthesis system had been reprogrammed to a new output frequency during the counting cycle depicted in the time interval $t_0$ to $t_{10}$ of FIG. 4, counters C, B and A would be loaded or preset in accordance with the newly programmed frequency at time $t_{10}$.

It should be noted that since the NOR gate 74 supplies the modulus control signal $S_{pc}$ at logic level 1 prior to time $t_9$ of FIG. 4, the final signal pulse of the prescaler signal $S_p$ is generated in response to ten pulses of the single sideband mixer signal $S_m$. Further, as previously described, the logic level of modulus control signal $S_{pc}$ during the final signal pulse of the prescaler signal $S_p$ (during time interval $t_9$ to $t_{10}$ in the counting cycle depicted in FIG. 4), is determined by the logic level of the pulse deletion signal supplied to the terminal 30 by the decade rate multiplier 48. As was also described, the logic level of the modulus control signal $S_{pc}$, during the final prescaler pulse of each counting cycle, determines the modulus of the two-modulus prescaler 50 during the "pulse deletion portion" of the next counting cycle, i.e., during the time interval in which the two-modulus prescaler 50 supplies the first signal pulse of the next counting cycle. More explicitly, since the signal supplied to the phase detector 22 and the decade rate multiplier 48 is a logical negation of the CCT signal (supplied by OR logic 56 via the inverter circuit 76), the phase detector 22 and decade rate multiplier 48 each receive a positive signal pulse during the time interval $t_7$ to $t_{10}$ of FIG. 4. If, as is assumed in the timing diagram of FIG. 4, the rate signal $M_1$ that is supplied to the decade rate multiplier 48 is such that this particular positive signal pulse causes the decade rate multiplier 48 to supply an output pulse, this output pulse will be present at the terminal 30 during the time interval corresponding to the final pulse of the prescaler signal $S_p$ (time interval $t_9$ to $t_{10}$ in the counting cycle depicted in FIG. 4). With the decade rate multiplier 48 supplying a positive signal level that corresponds to a logical 1 to one input terminal of the AND gate 72 via terminal 30 and the logical OR interconnection 64 supplying the second input terminal of the AND gate 72 with a logical 1 via the inverter circuit 70, the AND gate 72 couples a signal at logic level 1 to the $D_i$ input terminal of the flip-flop gate 78. The next $S_p$ signal (at time $t_9$) locks the Q output of the flip-flop 78 at logical 1 which, in turn, causes the NOR gate 74 to supply the modulus control signal $S_{pc}$ at logic level 0 during the time interval $t_9$–$y_{10}$. Accordingly, the two-modulus prescaler 50 generates the first prescaler pulse of the next timing cycle ($t_{10}$–$t_{11}$) in response to the first group of eleven pulses supplied by the single sideband mixer 14 (signal $S_m$).

On the other hand, if during the depicted counting cycle the rate signal $M_1$ of the decade rate multiplier 48 is currently such that the decade rate multiplier does not supply a positive signal pulse during the time interval $t_7$ to $t_{10}$, it can be seen that both inputs of the NAND gate 74 will be at logic level 0. Thus, in this situation, the NAND gate 74 supplies the modulus control signal $S_{pc}$ at logic level 1 during the time interval $t_9$ to $t_{10}$ to thereby cause the two-modulus prescaler 50 to operate with modulus ten during the generation of the first prescaler pulse of the next counting cycle.

Thus, it can be seen that, during the single counting cycle depicted in FIG. 4, the pulse deletor/programmable divider 34 supplies a single output pulse (time interval $t_7$ to $t_{10}$). In particular, it can be seen that this counting cycle includes a first interval ($t_0$ to $t_1$) which corresponds to either ten or eleven of the signal pulses supplied by the single sideband mixer 14 (depending on the state of the pulse deletion signal), includes a second interval in which A prescaler pulses are supplied in response to the next A groups of eleven signal pulses supplied by the single sideband mixer 14 (time interval $t_1$ to $t_5$ in FIG. 4), and includes a third time interval in which $N_p − A − 1$ prescaler pulses are supplied in response to the next 10 ($N_p − A − 1$) signal pulses of the signal supplied by the single sideband mixer 14.

Further, if a pulse delete signal is not supplied to the terminal 30 immediately prior to a particular counting cycle (e.g., $t_9$–$t_{10}$ of FIG. 4), the pulse deletor/programmable divider 34 supplies a single pulse to the phase detector 22 and decade rate multiplier 48 in response to $10N_p + A = 100C + 10B + A$ signal pulses of the single sideband mixer signal $S_m$ (434 signal pulses of the single sideband mixer signal $S_m$ in the example of FIG. 4). On the other hand, if a pulse delete signal is supplied to the terminal 30 prior to the start of a particular timing cycle, the pulse deletor/programmable divider 34 supplies a single signal pulse to the phase detector 22 and decade rate multiplier 48 corresponding to $10N_p + A + 1 = 100C + 10B + A + 1$ signal pulses of the signal supplied by the single sideband mixer 14 (435 signal pulses of the single sideband mixer signal $S_m$ in the example of FIG. 4). Accordingly, when operation over a sufficient time period is considered, i.e., the time period requied for $10^m$ counting cycles where m is the number of stages included in the decade rate multiplier 48, the average ratio of the signal frequencies supplied by the single sideband mixer 14 to the pulse frequency of the signal supplied by the pulse deletor/programmable divider 34 is $100C + 10B + A + M_1/10^m$, where $M_1$ is the m digit rate command applied to the decade rate multiplier 48. Since the single sideband mixer 14 supplies a signal to the pulse deletor/programmable divider 34 at a frequency of $f_v − f_s$ and the phase-locked loop will synchronize or lock when the pulse deletor/programmable divider 34 supplies signal pulses at a frequency corresponding to the reference frequency $f_r$, it can be recognized that VCO 16 of FIG. 3 supplies a signal at a frequency of $Nf_r + f_d + f_s = f_r(100C + 10B + A) + f_r M_1/10^m + N_2 f_r/N_3 \cdot (1 + M_2/10^p)$ where, as previously described, the OR gate 44 of FIG. 3 supplies the mixer control frequency $f_s$ at the frequency $N_2 f_r(1 + M_2/10^p)/N_3$.

Thus, the frequency synthesizer system of FIG. 3 supplies a signal at a programmable output frequency where specific digits of the output frequency are controlled by the programming signals applied to the counters C, B and A of the pulse deletor/programmable divider 34, by each digit of the pulse delete frequency $f_d$, and by each digit of the mixer control frequency $f_s$. For example, with respect to the previously-mentioned implementation of the embodiment of FIG. 3, wherein a two-decade rate multiplier and four-decade rate multiplier are respectively utilized as the decade rate multipliers 48 and 42, $N_2/N_3$ is established equal to $10^{-2}$ and $f_r$ is equal to one megahertz, a frequency of 434.987651 megahertz can be selected by establishing C equal to 4, B=3, A=4, $M_1$=97 and $M_2$=7651. With an embodiment of the invention programmed in this manner, the single sideband mixer 14 supplies a signal at 434.97 megahertz to the pulse deletor/programmable divider 34 and the pulse deletor/programmable divider 34 operates as indicated by FIG. 4 with 97 of every 100 counting cycles including a pulse deletion signal which causes the pulse deletor/programmable divider 34 to delete pulses at a rate of 970 kilohertz and thus, supply a signal at 1 megahertz to the phase detector 22.

As previously described, although FIG. 3 depicts an embodiment of the invention wherein combined pulse deletion and programmable frequency division is effected, various other pulse incrementor circuits of the pulse deletion and pulse adder variety can be utilized in the practice of this invention. In this respect FIGS. 5 and 7 respectively depict a pulse deletor circuit and a pulse adder circuit which can be utilized as the pulse incrementor 12 of the arrangement of the invention depicted in FIG. 1.

Figure 5:
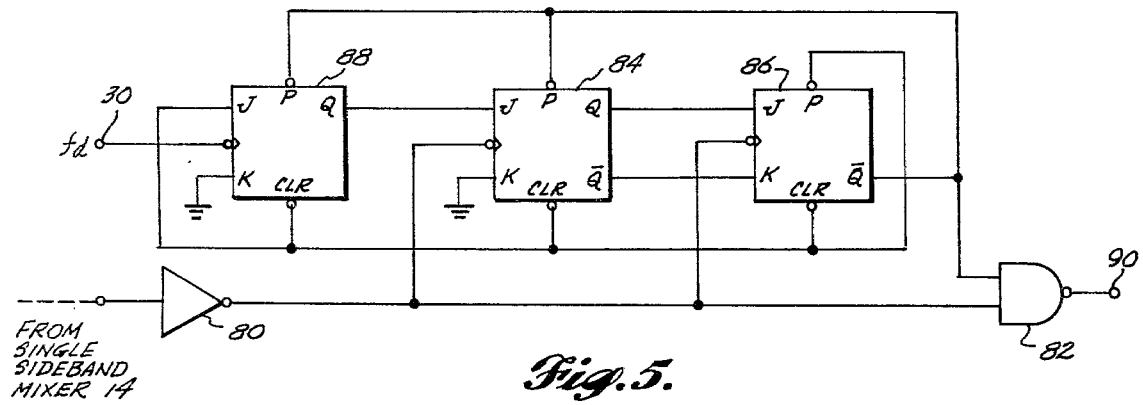
FIG. 5 is a schematic diagram of a pulse incrementor circuit of the pulse deletor variety which can be utilized in the practice of the invention.

In the pulse deletor circuit of FIG. 5, the signal supplied by the single sideband mixer 14 of FIG. 1 is inverted by a conventional inverter circuit 80 and coupled to one input terminal of a NAND gate 82 and to the negative clock inputs of two conventional J-K flip-flops 84 and 86. In this arrangement, the clock input of a third J-K flip-flop 88 is connected to the terminal 30 of FIG. 1 for receiving the pulse deletion signal. The second input terminal of the NOR gate 82 is connected to the $\overline{Q}$ output of flip-flop 86, which is also connected to the preset terminals of flip-flops 84 and 88. The K input of flip-flops 88 and 84 are connected to a signal potential which corresponds to a logical 0 (ground or circuit common in the arrangement of FIG. 5). The J inputs of flip-flops 84 and 86 are respectively connected to the Q output of the flip-flops 88 and 84, the $\overline{Q}$ output of flip-flop 84 is connected to the K input of flip-flop 86 and the J input of the flip-flop 88 is connected to the clear inputs (CLR) of each flip-flop 84, 86 and 88 and to the preset input of flip-flop 86.

Figure 6:
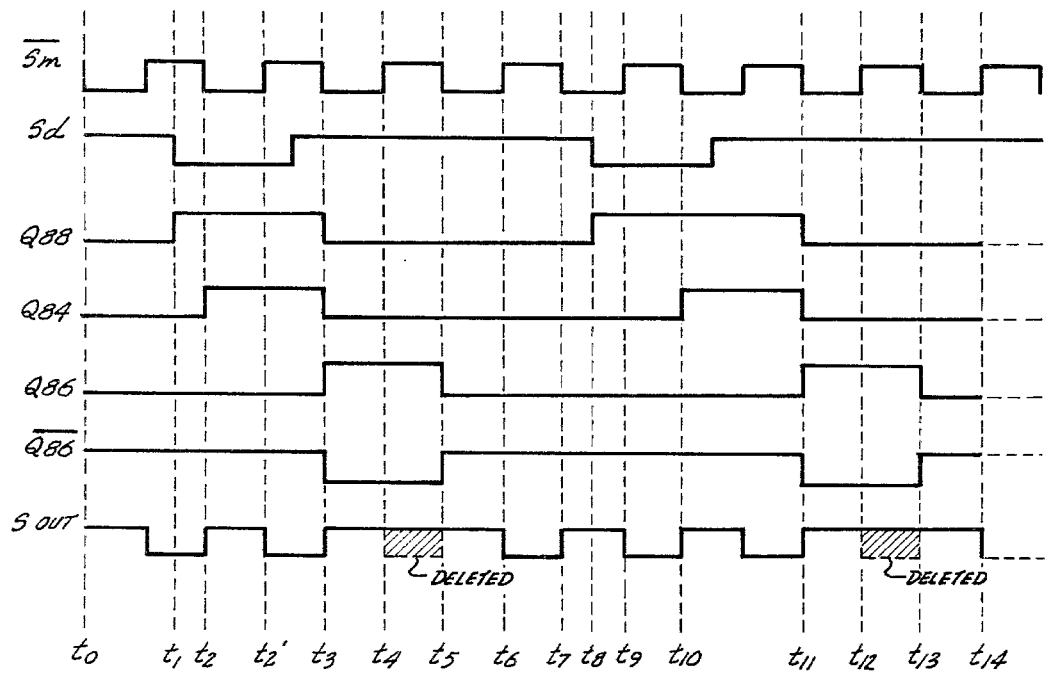
FIG. 6 is a timing diagram useful in understanding the pulse deletor circuit of FIG. 5.

With reference to the timing diagram of FIG. 6, as long as the pulse delete signal $S_d$ remains at a logic level 1, each of the flip-flops 84, 86 and 88 of the pulse deletor of FIG. 5 remains in the reset state (Q=0, $\overline{Q}$=1) with the J input of flip-flop 88 and the K input of flip-flop 86 equal to logical 1. Additionally, the J input of the flip-flops 84 and 86 and the K inputs of flip-flops 84 and 88 equal to a logical 0. In this condition, the $\overline{Q}$ output of flip-flop 86 ($\overline{Q}_{86}$ in FIG. 6) supplies a logical 1 to one input terminal of the NAND gate 82 and the inverted mixer signal, $\overline{S}_m$ which is supplied to the second input terminal of NAND gate 82, causes the NAND gate 82 to supply an output signal $S_{out}$ at the frequency of the applied mixer signal $\overline{S}_m$ (time interval $t_0$ to $t_3$ in FIG. 6).

If a negative transition of the pulse delete signal $S_d$ occurs while the mixer signal $\overline{S}_m$ is at a logic level of 1 (e.g., at time $t_1$ of the timing diagram of FIG. 6), flip-flop 88 will be set (Q=1, $\overline{Q}$=0) to thereby supply a logical 1 to the J input of flip-flop 84. Accordingly, the next negative transition of the $\overline{S}_m$ signal (at time $t_2$ in FIG. 6) causes the flip-flop 84 to set and the J and K inputs of flip-flop 86 to respectively become a logical 1 and a logical 0. Thus, the next negative-going transition of the $\overline{S}_m$ signal at time $t_3$ sets flip-flop 86 to thereby supply one input terminal of the NAND gate 82 with a logical 0. In addition, setting flip-flop 86 couples a logical 0 to the preset terminals of flip-flops 88 and 84 so that the Q outputs of flip-flop 88 and 84 return to the logical 0 state.

With the $\overline{Q}$ output of flip-flop 86 supplying a logical 0 to one input terminal of the NAND gate 82, the NAND gate 82 continues to supply the output signal $S_{out}$ at logic level 1 throughout the next positive excursion of the single sideband mixer signal $\overline{S}_m$ (time interval $t_4$ to $t_5$ of FIG. 6). The negative transition of the $\overline{S}_m$ signal at time $t_5$ causes flip-flop 86 to reset (Q=0, $\overline{Q}$=1) to thereby restore the pulse deletor circuit of FIG. 7 to the previously described quiescent state. Thus, the positive excursion of the single sideband mixer signal $\overline{S}_m$ which occurs during the time interval $t_5$ to $t_6$ causes the output signal $S_{OUT}$ to remain at logic level 1 until the negative transition of the $\overline{S}_m$ signal that occurs at time $t_6$. Examining the timing diagram of FIG. 6, it can be noted that the time interval $t_{2'}$ to $t_6$ corresponds to 2 periods of the mixer signal $\overline{S}_m$ and to a single output pulse of the output signal $S_{OUT}$. Thus, one signal pulse of the single sideband mixer signal is effectively deleted in response to the pulse deletion signal $S_d$ which occurred at time $t_1$.

If a negative transition of the pulse deletion signal $S_d$ occurs while the $\overline{S}_m$ signal is logical 0 (for example, as depicted at time $t_9$ in FIG. 6), flip-flop 88 is immediately set to accordingly supply the J input of flip-flop 84 with a logical 1 signal. Since the $\overline{Q}_{86}$ signal ($\overline{Q}$ output of flip-flop 86) remains at logic level 1 during the time interval $t_8$ to $t_{11}$, NAND gate 82 continues to supply an output signal in sychronization with the mixer signal $S_m$ during this time period. With the next negative transition of the $S_m$ signal at time $t_{10}$, flip-flop 84 is set such that the J and K inputs of flip-flop 86 become a logical 1 and a logical 0 respectively. Thus, the next negative signal transition of the mixer signal $S_m$ (at time $t_{11}$) sets the flip-flop 86 to change the logic level of the $\overline{Q}_{86}$ signal to a logical 0 and thereby reset flip-flops 84 and 88 and supply a logical 0 to one input terminal of the NAND gate 82. With a logical 0 coupled to one input terminal of the NAND gate 82, the NAND gate 82 continues to supply the output signal $S_{OUT}$ at logical level 1 throughout the next positive excursion of the mixer signal $\overline{S}_m$ (time $t_{12}$ to $t_{13}$). With the negative signal transition of the mixer signal $\overline{S}_m$ at time $t_{13}$, flip-flop 86 is reset such that the circuit of FIG. 5 is again in the quiescent state. Thus, during the negative excursion of the mixer signal $S_m$ in the time interval $t_{13}$ to $t_{14}$, the output signal $S_{OUT}$ remains at logical level 1 and, following time $t_{14}$, alternates between logic levels 1 and 0 in synchronization with the mixer signal $S_m$. Accordingly, since the output signal $S_{OUT}$ contains one less signal pulse during the time period $t_9$ to $t_{14}$ than does the mixer signal $\overline{S}_m$, the circuit of FIG. 5 effects the desired pulse deletion.

Although, as is illustrated in FIG. 6, the pulse deletor circuit of FIG. 5 does not supply a signal wherein the signal pulses are equally spaced in time, such a circuit can be satisfactorily utilized in an embodiment of the arrangement depicted in FIG. 1 as long as the pulse deletion frequency substantially exceeds the cutoff frequency of the phase-locked loop. As previously described, when the pulse deletion frequency substantially exceeds the phase-locked loop cutoff frequency, the loop suppresses spurious output signal components that would otherwise be generated by phase perturbations caused by such an irregular signal.

Figure 7:
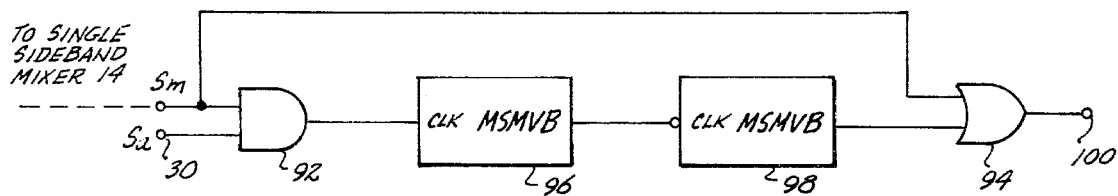
FIG. 7 is a pulse incrementor of the pulse adder variety that can be used in the practice of this invention.

The pulse adder circuit of FIG. 7 is one example of a circuit that can be employed as a pulse incrementor 12 in an embodiment of the invention depicted in FIG. 1 wherein the frequency synthesizer system is to supply an output signal at the frequency $Nf_r - f_d + f_s$ where, with respect to the mixer control frequency $f_s$, the operation of addition applies to an embodiment utilizing a lower sideband mixer as the mixer 14 and the operation of subtraction applies to an embodiment utilizing an upper sideband mixer. In the pulse adder of FIG. 7, the signal supplied by the single sideband mixer 14 ($S_m$) is connected to one input terminal of a conventional AND gate 92 and is also connected to one input terminal of a conventional OR gate 94. The second input terminal of the AND gate 92 is connected to terminal 30 of the arrangement of FIG. 1 for receiving a pulse adder command signal $S_a$. Accordingly, the AND gate 92 supplies a logical 1 signal to the clock terminal of a conventional monostable multivibrator or "one-shot" 96 whenever the signal level of the mixer signal $S_m$ and the pulse adder command signal $S_a$ concurrently correspond to a logical 1. The signal supplied by the one-shot 96 at a pulse duration substantially equal to one-half the period of the mixer signal $S_m$, is coupled to the negative clock input of the conventional monostable multivibrator or one-shot 98, having the output terminal thereof connected to the second input terminal of the OR gate 94. Thus, whenever the mixer signal $S_m$ and/or the pulse adder command signal $S_a$ change states such that both signals are logic level 1, the one-shot 96 supplies a pulse signal to the one-shot 98, the trailing edge or negative transition of which causes the one-shot 98 to supply a positive signal pulse of a desired time duration, to one input terminal of the OR gate 94. Since each pulse supplied by the one-shot 98 will occur substantially midway between adjacent pulses of the mixer signal $S_m$, the OR gate 94 effectively adds the pulse supplied by the one-shot 98 to the pulse train of the mixer signal $S_m$. Accordingly, the pulse adder arrangement of FIG. 7 supplies a signal to a terminal 100 which can be coupled to the programmable frequency divider 18 of FIG. 1 to cause the frequency synthesizer system of FIG. 1 to operate in the previously described manner.

Figure 8:
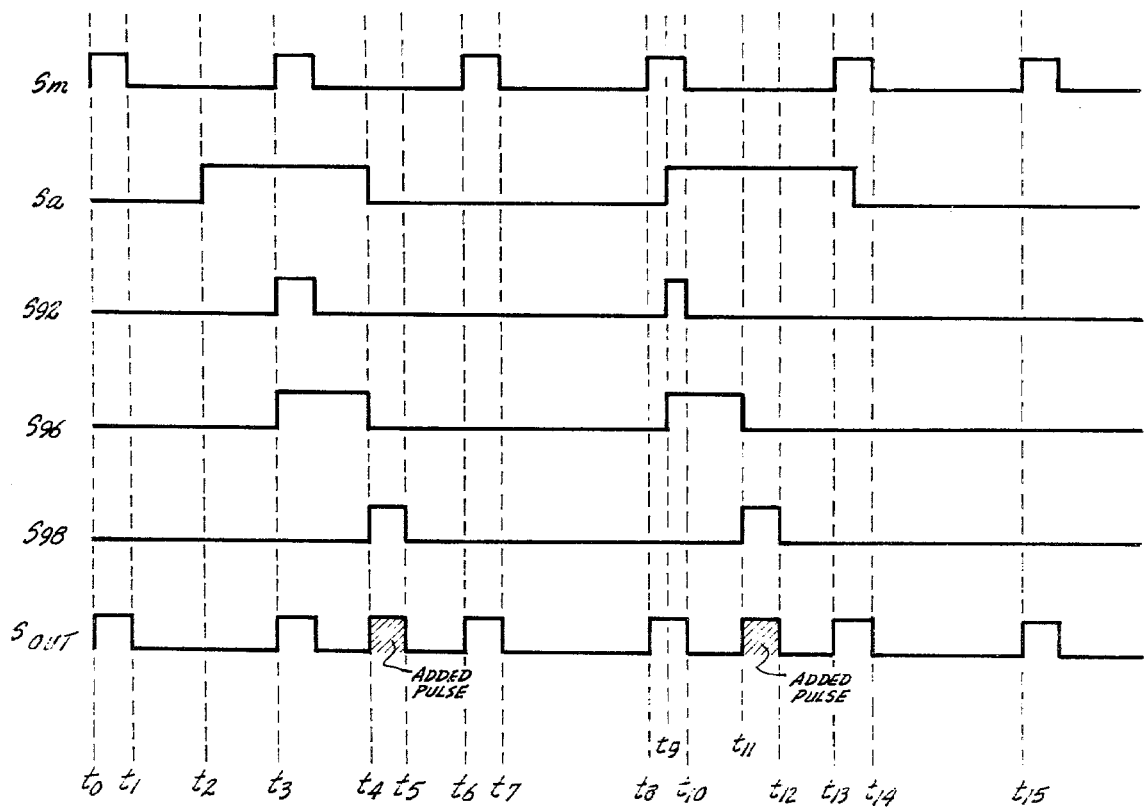
FIG. 8 is a timing diagram useful in understanding the operation of the pulse adder circuit depicted in FIG. 7.

Viewing the timing diagram of FIG. 8, it can be seen that, if a positive transition of the pulse adder command signal $S_a$ occurs while the mixer signal $S_m$ is low, for example, at time $t_2$ of FIG. 8, the AND gate 92 will supply a signal at logic level 1 (signal $S_{92}$ in FIG. 8) upon the next positive signal transition of the mixer signal $S_m$ (time $t_3$). The leading edge or positive transition of the signal supplied by the AND gate 92 causes the one-shot 96 to supply a positive signal pulse (signal $S_{96}$ in FIG. 8) of a duration substantially equal to one-half the period of the mixer signal $S_m$ (i.e., the time interval $t_3$ to $t_4$ in FIG. 8). In response to the negative transition or trailing edge of the $S_{96}$ signal (at time $t_4$), the one-shot 98 supplies a positive signal pulse ($S_{98}$ in FIG. 8) to one input terminal of the OR gate 94. As depicted by the $S_{OUT}$ in FIG. 8, the OR gate 94 supplies a signal to the output terminal 100 of FIG. 7, which includes each signal pulse of the mixer signal $S_m$ that occured in the time interval $t_0$ to $t_7$ and also includes the signal pulse that is "added" by the one-shot 98 during the time interval $t_4$ to $t_5$.

As depicted by the time interval $t_9$ to $t_{14}$ of FIG. 8, arrival of the pulse-add command signal $S_a$ while the mixer signal $S_m$ is high, immediately activates the AND gate 92 to cause the signal $S_{92}$ to become a logical 1 (time $t_9$ in FIG. 8). As in the previously described situation, when the AND gate 92 supplies a logical 1 to the one-shot 96, the one-shot 96 supplies a signal pulse $S_{96}$ to the one-shot 98 with the trailing edge of this signal pulse at time $t_{11}$ causing the one-shot 98 to supply the OR gate 94 with a signal pulse between the times $t_{11}$ and $t_{12}$ (signal $S_{98}$ in FIG. 8). Since the mixer signal $S_m$ is low at this time, the OR gate 94 again effectively inserts or adds the signal pulse supplied by the one-shot 98 between the mixer signal pulse supplied during the time interval $t_8$ to $t_{10}$ and the mixer signal pulse supplied during the time interval $t_{13}$ to $t_{14}$.

With respect to the pulse adder circuit of FIG. 7, it can be recognized that propagation delays are experienced which determine the maximum frequency at which the circuit arrangement can be employed. In particular, the one-shot 98 must supply the added pulse to the OR gate 94 during a time period in which the mixer signal $S_m$ is low. Further, since the frequency of the mixer signal $S_m$ is not constant, but varies over a frequency range determined by the frequency range of the frequency synthesizer system, the one-shot 96 of the pulse-adder circuit of FIG. 7 does not supply a signal pulse of a duration equal to one half the period of the mixer signal $S_m$ for each of the programmed output frequencies. In this respect, it is generally satisfactory to configure the one-shot 96 for supplying a pulse having a duration equal to one-half the mean period of those output frequencies supplied by the synthesis system. As described relative to FIG. 1, maintaining the frequency of the pulse-adder command signal substantially above the cutoff frequency of the phase-locked loop prevents the phase perturbations, introduced by the added pulse signals, from causing substantial spurious output signals.

As previously mentioned, the level of spurious signal suppression achieved within the embodiments of the invention depicted in FIGS. 1 and 3 may not be sufficient to meet the design requirements imposed on certain frequency synthesis applications. In such a situation, additional spurious signal suppression can be effected by including the circuit depicted in FIG. 9 within the previously described embodiments of the invention.

Figure 9:
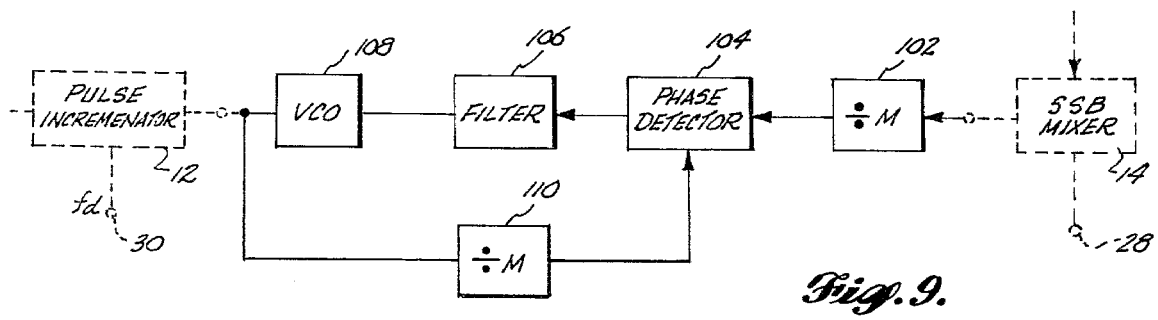
FIG. 9 schematically depicts an additional phase-locked loop circuit which can be embedded between the single sideband mixer and pulse incrementor circuit of the arrangement of this invention depicted in FIGS. 1 and 3 to provide additional suppression of spurious output signal components.

In the arrangement of FIG. 9, a frequency divider circuit 102 is connected for receiving the signals supplied by the single sideband mixer 14 at the frequency $f_v - f_s$, where, as previously described, $f_v$ is the frequency of the VCO 16 of the embodiment of FIG. 1 or FIG. 3, and $f_s$ is the frequency of the control signal supplied to input port of the single sideband mixer 14. The signal supplied by the frequency divider 102 is coupled to one input terminal of a conventional phase detector 104 to serve as the reference frequency of a phase-locked loop which includes the phase detector 104, a low-pass filter 106, a voltage controlled oscillator (VCO) 108 and a frequency divider 110. In the conventional manner, the VCO 108 supplies the circuit output signal which is coupled to the pulse incrementor 12 of FIG. 1 or the pulse deletor/programmable divider 34 of FIG. 3 and the frequency divider 110 is interconnected between the VCO 108 and the phase detector 104 to supply the loop feedback signal to the second input terminal of the phase detector 104 and thereby cause the circuit of FIG. 9 to lock to a frequency determined by the frequency of the signal supplied by the single sideband mixer 14.

In this arrangement, the frequency divider 102 is utilized to prescale the signal frequency $f_v - f_s$ of the signal supplied by the single sideband mixer 14 and thereby supply a reference frequency of $(f_v - f_s)/M$ to the phase detector 104, where M is the value of the divisor of the phase detector 102. Such prescaling, although not necessary in all situations, is often advantageously employed to reduce the frequency of operation of the phase detector 104 and may be necessary in situations in which the signal supplied by the synthesizer system is phase or frequency modulated.

When such prescaling is employed, the divisor of the frequency divider 110 is often established equal to M such that the signal supplied by the VCO 108 is identically equal to the desired mixer output frequency $f_v - f_s$ (or $f_v + f_s$, in embodiments wherein an upper sideband mixer is utilized). In certain other situations, it may be advantageous to utilize unequal divisor factors within the frequency dividers 102 and 110 to further offset the frequency of the VCO 108 from the frequency of the VCO 16 of the phase-locked loop utilized in the frequency synthesizer arrangements of FIGS. 1 and 3.

In any case, the phase-locked loop of the circuit arrangement of FIG. 9 is configured to have a relatively narrow bandwidth to thereby effectively serve as a tracking filter which passes the desired frequency component $f_v - f_s$ of the signal supplied by the single sideband mixer 14 while simultaneously attenuating other signal components such as the unwanted sideband $(f_v + f_s)$, the frequency $f_v$ of the signal supplied by the VCO 16 of the frequency synthesizer system and various intermodulation frequencies of the VCO 16 signal and the mixer control signal. Since spurious signal components which fall within the passband of the phase-locked loop of the embodiments in the invention depicted in FIG. 1 and FIG. 3 result primarily from these undesirable mixer signal components and from subsequent modulation processes which these signals inherently undergo within conventional devices that can be employed as the programmable frequency divider 18 and the phase detector 22, substantial improvement (e.g., 30 dB or more) in the suppression of spurious signal components can be achieved when the circuit of FIG. 9 is incorporated into the frequency synthesis system of this invention.

Those skilled in the art will recognize that the bandwidth of the phase-locked loop of FIG. 9 should be established in view of the bandwidth of the main phase-locked loop that is formed within the previously described embodiments of the invention. Additionally, if the frequency synthesizer main phase-locked loop is to include means for frequency modulating the synthesized output signal, the bandwidth of the additional phase-locked loop of FIG. 9 should be established, at least in part, on the basis of the maximum desired frequency deviation and the maximum modulation frequency to thereby minimize FM distortion within the overall system.

It should be recognized by those skilled in the art that the embodiments of the invention described are exemplary in nature and that many variations therein can be practiced without exceeding the scope and spirit of this invention. For example, as previously described, various circuit arrangements can be utilized to realize a circuit which functions as the described pulse incrementor of either the pulse deletor or pulse adder variety. Further, with respect to the embodiment of FIG. 3, various arrangements of conventional logic circuits can be employed to perform the control operations described relative to the combined pulse deletor/programmable divider 34. In addition, in many situations, the conventional logic circuits used to implement portions of the invention, such as the pulse deletor/programmable divider of FIG. 3, will often include circuits of the transistor-transistor logic type (TTL) and logic circuits of the emitter-coupled logic variety (ECL). In such situations, standard circuit arrangements for appropriate translation of the logic signal levels are employed.

Moreover, it will be recognized that a variety of frequency control means ranging from conventional rotary switches to computer-implemented apparatus can be utilized to establish the signal frequencies $f_r$, $f_s$ and $f_d$ to thereby determine the output frequency $f_v$ of each embodiment of the invention. In this regard, since a minimum value of $f_s$ that is greater than the loop cutoff frequency is utilized to suppress spurious signal components, it is generally desirable that such frequency control means include means for arithmetically compensating for the frequency offset that would otherwise exist. For example, in the embodiments discussed herein wherein the minimum value of $f_s$ is 10 kilohertz and $f_v = Nf_r + f_d + f_s$, a signal corresponding to 10 kilohertz of frequency control is substantial from the frequency programming signal. In one digitally-programmed embodiment of the invention wherein a microprocessor is employed to handle various functions that are beyond the scope of the present invention, the microprocessor was employed to, in effect, calculate the necessary frequency programming signal from a digitally-encoded signal representative of the desired frequency.

The embodiments of the invention in which an exclusive property or privilege is claimed are defined as follows:

1. In a frequency synthesizer system of the phase-locked loop variety wherein an output signal is supplied by a first voltage controlled oscillator, said output signal having a frequency determined by an error signal supplied to said first voltage controlled oscillator by a first phase detector circuit, said first phase detector circuit being responsive to an applied signal at a predetermined frequency $f_r$ and being responsive to a feedback signal derived from said output and having a frequency mathematically related to the frequency of said output signal, and wherein the apparatus for supplying said feedback signal includes a programmable frequency divider having an output terminal connected for supplying said feedback signal to said first phase detector, said programmable frequency divider for dividing the frequency of an applied signal by an integer N, said integer N being programmable between upper and lower limits that control said frequency of said output signal in incremental frequency steps equal in magnitude to said predetermined frequency $f_r$, an improvement for controlling said frequency of said output signal in incremental frequency steps of a magnitude less than $f_r$, said improvement comprising:

single sideband mixing means responsive to said output signal and responsive to an applied signal having a selectable frequency $f_s$ that exceeds the cutoff frequency of said phase-locked loop, said single sideband mixing means supplying a signal having a frequency substantially equal to said frequency of said output signal offset by an amount substantially equal to said selectable frequency $f_s$; and, frequency incrementing means responsive to said signal supplied by said single sideband mixing means and responsive to an applied signal having a selectable frequency $f_d$ that exceeds the cutoff frequency of said phase-locked loop, said frequency incrementing means including means for supplying a signal at a frequency substantially equal to said frequency supplied by said single sideband mixing means offset by an amount substantially equal to said selectable frequency $f_d$ to said programmable frequency divider.

2. The frequency synthesis system of claim 1 wherein said improvement further comprises a phase-locked loop circuit connected for receiving said signal supplied by said single sideband mixing means, said phase-locked loop circuit being configured and arranged for filtering said signal supplied by said single sideband mixing means to suppress signal components at frequencies other than said frequency that is substantially equal to said output signal offset by an amount substantially equal to said selectable frequency $f_s$.

3. The frequency synthesizer system of claim 1 wherein said single sideband mixing means is a lower sideband mixer circuit for supplying said signals to said frequency incrementing means at a frequency substantially equal to $f_v - f_s$, where $f_v$ is the frequency of said output signal, and wherein said frequency incrementing means is configured and arranged for supplying said signal to said programmable frequency divider at a frequency substantially equal to $f_v - f_s - f_d$, said programmable frequency divider dividing said signal supplied by said frequency incrementing means by said selectable integer N to cause said phase detector to supply an error signal that establishes the frequency $f_v$ of said voltage controlled oscillator substantially equal to $Nf_r+f_s+f_d$.

4. The frequency synthesis system of claim 3 wherein the improvement further comprises means for supplying said signal applied to said mixing means at said selectable frequency $f_s$ and means for supplying said signal applied to said frequency incrementing means at said selectable frequency $f_d$, said means for supplying said signal at said selectable frequency $f_s$ including means for establishing said selectable frequency $f_s$ between a lower frequency of $f_{s1}$ and an upper frequency of $f_{s2}$ in predetermined frequency increments of $\Delta f_s$, said means for supplying said signal at said selectable frequency $f_d$ including means for establishing said selectable frequency $f_d$ between a lower frequency of $f_{d1}$ and an upper frequency of $f_{d2}$ in predetermined frequency increments of $\Delta f$, said upper and lower frequency limits and said predetermined frequency increments being selected to establish the quantity $f_{s2}-f_{s1}+\Delta f_s$ at least equal to $\Delta f_d$ and establish the quantity $f_{d2}-f_{d1}+\Delta f_d$ at least equal to the value of said predetermined frequency $f_r$ of said reference signal supplied to said phase detector.

5. The frequency synthesis system of claim 4 wherein the improvement further comprises a phase-locked loop circuit for filtering said signal supplied by said single sideband mixing means, said phase-locked loop circuit including a second phase detector circuit, first and second frequency divider circuits having fixed divisors that are substantially equal to predetermined integers, and a second voltage controlled oscillator, said first frequency divider circuit being connected for receiving said signal supplied by said signal mixing means and supplying a signal at a frequency substantially equal to said signal supplied by said single sideband mixing means divided by said fixed integral divisor of said first frequency divider circuit, said second voltage controlled oscillator having a frequency control terminal and having an output terminal, said output terminal connected for supplying said signal supplied by said single sideband mixing means to said frequency incrementing means, said second frequency divider circuit having an input terminal connected to said output terminal of said second voltage controlled oscillator and having an output terminal for supplying a signal at a frequency substantially equal to the frequency of said signal supplied by said second voltage controlled oscillator divided by said fixed integral divisor of said second frequency divider circuit, said second phase detector having first and second input terminals respectively connected for receiving said signal supplied by said first and second frequency divider circuits, said second phase detector circuit having an output terminal connected for supplying a signal to said frequency control terminal of said second voltage controlled oscillator.

6. A frequency synthesizer system for supplying an output signal at a selectable frequency $f_v=Nf_r\pm f_d\pm f_s$, where N is a selectable integer, $f_r$ is the frequency of an applied reference signal and $f_d$ and $f_s$ are respectively the frequencies of first and second applied control signals, each of said frequencies $f_d$ and $f_s$ being selectable from a plurality of signal frequencies, said frequency synthesizer system comprising:

controlled oscillator means, said controlled oscillator means responsive to an applied error signal for supplying the output signal of said frequency synthesizer system at a frequency determined by said error signal;

single sideband mixing means responsive to said signal supplied by said controlled oscillator means as said output signal of said frequency synthesizer system, said single sideband mixing means further responsive to said first applied control signal at said frequency $f_s$, said single sideband mixing means including means for supplying a signal at a frequency substantially equal to $f_v\pm f_s$;

pulse incrementor means responsive to said signal supplied by said signal mixing means and responsive to said second applied control signal at said selectable frequency $f_d$, said pulse incrementor means supplying a signal at a frequency substantially equal to $f_v\pm f_s\pm f_d$;

frequency divider means responsive to said signal supplied by said pulse incrementor means, said frequency divider means being programmable to supply a signal at a frequency substantially equal to $(f_v\pm f_s\pm f_d)/N$, where N is said selectable integer;

phase detector means responsive to said signal supplied by said frequency divider means and responsive to said applied reference signal at said frequency $f_r$, said phase detector means including means for supplying said error signal with a magnitude proportional to the difference between the phase of said signal supplied to said phase detector means by said frequency divider means and the phase of said reference signal at said frequency $f_r$; and, means for maintaining of said frequency $f_s$ and said frequency $f_d$ greater than the cutoff frequency of the phase-locked loop defined by said controlled oscillator means, said frequency divider means and said phase detector means.

7. The frequency synthesis system of claim 6 wherein said single sideband mixing means includes means for supplying a signal at a frequency substantially equal to $f_v+f_s$ and wherein said pulse incrementor means includes means for supplying a signal at a frequency substantially equal to $f_v+f_s+f_d$ to establish said selectable output frequency $f_v$ substantially equal to $Nf_r-f_d-f_s$.

8. The frequency synthesizer system of claim 6 wherein said single sideband mixing means includes means for supplying a signal at a frequency substantially equal to $f_v-f_s$ and wherein said pulse incrementor means includes means for supplying a signal at a frequency substantially equal to $f_v-f_s+f_d$ to establish said selectable output frequency $f_v$ substantially equal to $Nf_r+f_s-f_d$.

9. The frequency synthesizer system of claim 6 wherein said single sideband mixing means includes means for supplying a signal at a frequency substantially equal to $f_v+f_s$ and wherein said pulse incrementor means includes means for supplying a signal at a frequency substantially equal to $f_v+f_s-f_d$ to establish said selectable output frequency $f_v$ substantially equal to $Nf_r-f_s+f_d$.

10. The frequency synthesizer system of claim 6 wherein said single sideband mixing means includes means for supplying a signal at a frequency substantially equal to $f_v-f_s$ and wherein said pulse incrementor means includes means for supplying a signal at a frequency substantially equal to $f_v-f_s-f_d$ to establish said selectable output frequency $f_v$ substantially equal to $Nf_r+f_d+f_s$.

11. The frequency synthesizer system of claim 8, or 10 further comprising a phase-locked loop circuit for filtering said signal supplied by said single sideband mixing means, said phase-locked loop being connected for receiving said signal supplied by said single sideband mixing means and being configured and arranged for supplying said signal supplied by said single sideband mixing means to said pulse incrementor means, said phase-locked loop being connected and arranged for attenuating signal components within said signal supplied by said single sideband mixing means at frequencies other than said frequency $f_v - f_s$.

12. The frequency synthesizer system of claims 7 or 9 further comprising a phase-locked loop circuit for filtering said signal supplied by said single sideband mixing means, said phase-locked loop being connected for receiving said signal supplied by said single sideband mixing means and being configured and arranged for supplying said signal supplied by said single sideband mixing means to said pulse incrementor means, said phase-locked loop being connected and arranged for attenuating signal components within said signal supplied by said single sideband mixing means at frequencies other than said frequency $f_v + f_s$.

13. The frequency synthesizer system of claims 7, 8, 9 or 10 further comprising signal supply means for supplying said first and second applied control signals, said signal supply means including means for establishing said selectable frequency $f_d$ of said first control signal between a lower frequency of $f_{d1}$ and an upper frequency of $f_{d2}$ in predetermined frequency increments of $\Delta f_d$, said signal supply means further including means for establishing said frequency $f_s$ of said second control signal between a lower frequency of $f_{s1}$ and an upper frequency of $f_{s2}$ in predetermined frequency increments of $\Delta f_s$, each of said upper and lower frequencies and each of said predetermined frequency increments being selected to establish the quantity $f_{s2} - f_{s1} + \Delta f_s$ at least equal to $\Delta f_d$ and being selected to establish the quantity $f_{d2} - f_{d1} + \Delta f_d$ at least equal to the value of said frequency $f_r$ of said applied reference signal.

14. A frequency synthesis system for supplying an output signal at a signal frequency that is selectable from a plurality of signal frequencies, said frequency synthesis system comprising:
phase detector means responsive to an applied reference signal having a predetermined frequency and responsive to a first applied system signal, said phase detector means for supplying an error signal, said phase detector means including means for establishing said error signal directly proportional to the difference in signal phase between said applied reference signal and said first system signal;
controlled oscillator means responsive to said error signal for supplying a signal as said frequency synthesizer output signal, said controlled oscillator means including means for varying the frequency of said supplied signal in proportion to the magnitude of said error signal;
single sideband mixer means responsive to a first control signal having a selectable frequency and responsive to said signal supplied by said controlled oscillator means, said signal sideband mixer means for supplying a signal having a frequency substantially equal to the difference between the frequency of said signal supplied by said control oscillator means and said selectable frequency of said first control signal;
signal processing means, said signal processing means responsive to said signal supplied by said single sideband mixer means and responsive to a second control signal having a selectable frequency, said signal processing means including means for supplying said first system signal to said phase detector means at a frequency substantially equal to the quotient of the difference between the frequency of said signal supplied by said single sideband mixer means and said selectable frequency of said second control signal divided by a selectable integer N;
first signal supply means for supplying said first control signal at a frequency greater than $K_p K_v/N$ where $K_p$ denotes the coefficient of said phase detector means that relates said difference in signal phase to said error signal and $K_v$ denotes the coefficient of said controlled oscillator means that relates the frequency of the signal supplied by said controlled oscillator means to said error signal; and,
second signal supply means for supplying said second control signal at a frequency greater than $K_p K_v/N$.

15. A frequency synthesis system for supplying an output signal at a signal frequency that is selectable from a plurality of signal frequencies, said frequency synthesis system comprising:
phase detector means responsive to an applied reference signal having a predetermined frequency and responsive to a first applied system signal, said phase detector means for supplying an error signal, said phase detector means including means for establishing said error signal directly proportional to the difference in signal phase between said applied reference signal and said first system signal;
controlled oscillator means responsive to said error signal for supplying a signal as said frequency synthesizer output signal, said controlled oscillator means including means for varying the frequency of said supplied signal in proportion to the magnitude of said error signal;
single sideband mixer means responsive to a first control signal having a selectable frequency and responsive to said signal supplied by said controlled oscillator means, said single sideband mixer means for supplying a signal having a frequency substantially equal to the sum of the frequency of said signal supplied by said controlled oscillator means and said selectable frequency of said first control signal;
signal processing means, said signal processing means responsive to said signal supplied by said single sideband mixer means and responsive to a second control signal having a selectable frequency, said signal processing means including means for supplying said first system signal to said phase detector means at a frequency substantially equal to the quotient of the sum of the frequency of said signal supplied by said single sideband mixer means and said selectable frequency of said second control signal divided by a selectable integer N;
first signal supply means for supplying said first control signal at a selectable frequency that exceeds $K_p K_v/N$ where $K_p$ denotes the coefficient of said phase detector means that relates said difference in signal phase to said error signal and $K_v$ denotes the coefficient of said controlled oscillator means that relates the frequency of the signal supplied by said controlled oscillator means to said error signal; and, second signal supply means for supplying said second control signal at a selectable frequency that exceeds $K_p K_v/N$.

16. The frequency synthesizer system of claim 14 or claim 15 wherein said signal processing means includes a two modulus prescaler circuit, first and second counter circuits and control logic means, said two modulus prescaler circuit being connected for receiving said signal supplied by said single sideband mixing means and being responsive to an applied logic control signal, said two modulus prescaler circuit including means for supplying a single signal pulse to said first and second counter circuits in response to a first predetermined number of signal pulses of said signal supplied by said single sideband mixer means when said logic control signal is a first predetermined value, said two modulus prescaler circuit further including means for supplying a single signal pulse to said first and second counter circuits in response to a second predetermined number of signal pulses of said signal supplied by said single sideband mixer means when said logic control signal is a second predetermined value, said first and second counter circuits being respectively programmable to predetermined values of $N_p$ and A where $N_p+A$ is equal to said selectable integer N, said control logic means including means for periodically supplying a signal to said first and second counter circuit to program said first and second counter circuits to said values of $N_p$ and A to initiate a counting cycle of a time duration equal to the time period in which said two modulus prescaler circuit supplies $N_p$ signal pulses, said control logic means including means responsive to said second control signal for supplying said logic control signal at said first predetermined value during a time period in which said two modulus prescaler supplied a particular one of said signal pulses of said $N_p$ pulses if said second control signal is at a first predetermined value and including means for supplying said logic control signal at said second predetermined value during said time in which said two modulus prescaler circuit supplies said particular one of said signal pulses of said $N_p$ signal pulses if said second control signal is at said second predetermined value, said logic control means including means for supplying said logic control signal at said second predetermined value during an additional interval of time in which said two modulus prescaler supplies a number of said $N_p$ signal pulses that is identically equal to said value A, said control logic means further including means for supplying said logic control signal at said first predetermined value during the time interval in which said two modulus prescaler circuit supplies the remaining $(N_p-A-1)$ signal pulses of said $N_p$ signal pulses supplied by said two modulus prescaler circuit, said control logic means further including means for supplying a single signal pulse as said first system signal during said time interval in which said two modulus prescaler supplies sand $N_p$ signal pulses of said counting cycle.

17. The frequency synthesizer system of claim 16 further comprising circuit means for supplying said first control signal and circuit means for supplying said second control signal, said circuit means for supplying said first control signal being responsive to a signal at a frequency substantially equal to an integal multiple of said predetermined frequency of said reference signal supplied to said phase detector means and including means for supplying said first control signal at a frequency substantially equal to $(N_2 f_r/N_3)(1+N_1/10^p)$, where $N_2 f_r$ is equal to said integral multiple of said predetermined frequency of said reference signal, $N_3$ and p are preselected integers, and $N_1$ is an integer selectable from the set of integers ranging between 0 and $10^p-1$, said means for supplying said second control signal being responsive to a signal at a frequency substantially equal to said frequency of said reference signal supplied to said phase detector means and including means for supplying said second control signal at a frequency substantially equal to $f_r M_2/10^m$ where m is a preselected integer, $f_r$ is said predetermined frequency of said reference signal, and $M_2$ is an integer selectable from the set of integers ranging between 0 and $10^m-1$.

18. The frequency synthesizer system of claim 17 wherein said circuit means for supplying said first control signal includes a clock circuit having an input terminal connected for receiving a signal at said frequency $N_2 f_r$ and having first and second output terminals for supplying signals at said frequency $N_2 f_r$ with a predetermined phase difference being exhibited between the signals supplied at said first and second output terminals of said clock circuit, said circuit means for supplying said first control signal further including a first decade rate multiplier circuit and a two input OR gate, said first decade rate multiplier circuit having an input terminal connected for receiving said signal supplied at said first output terminal of said clock circuit and having an output terminal connected for supplying a signal to one input of said two input OR gate, said second input of said two input OR gate being connected for receiving said signal supplied at said second output terminal of said clock circuit, said circuit means for supplying said first control signal further comprising a frequency divider circuit having a divisor equal to said integer value of $N_3$, said frequency divider circuit having an input terminal connected for receiving the signal supplied by said two input OR gate and having an output terminal connected for supplying said first control signal.

19. The frequency synthesizer system of claim 18 wherein said means for supplying said second control signal includes a second decade rate multiplier circuit, said second decade rate multiplier circuit being connected for receiving each of said signal pulses supplied by said control logic means as said first system signal, said second decade rate multiplier circuit having an output terminal connected for supplying said second control signal.

20. The frequency synthesizer system of claim 19 further comprising a second frequency divider circuit having a divisor equal to said integer $N_2$, said second frequency divider circuit having an input terminal connected for receiving said signal at said frequency $N_2 f_r$ and having an output terminal connected for supplying said reference signal to said phase detector means.

* * * * *

UNITED STATES PATENT AND TRADEMARK OFFICE
CERTIFICATE OF CORRECTION

PATENT NO. : 4,360,788
DATED : November 23, 1982
INVENTOR(S) : Erps et al.

It is certified that error appears in the above—identified patent and that said Letters Patent is hereby corrected as shown below:

Column 4, line 65, "delector" should be --deletor--

Column 6, line 35, delete --is-- after "12"

line 57, "a" should be --an-- line 60, "$f_v + f_s + f_d$" should be --$f_v + f_s - f_d$--

Column 8, line 26, "$S_i = 1, 2, ...,$" should be --$S_i, i = 1, 2, ...,$-- line 68, "signals" should be --signal--

Column 9, line 42, "coefficient" should be --coefficients--

Column 11, line 7, insert --a-- after "is"

lines 42/43, "outputfrequency" should be --output frequency-- line 52, insert --signal-- after "the"

Column 12, line 25, "operaton" should be --operation--

Column 13, line 24, "grup" should be --group--

Column 17, line 59, insert --at-- after "least"

UNITED STATES PATENT AND TRADEMARK OFFICE
CERTIFICATE OF CORRECTION

PATENT NO. : 4,360,788

DATED : November 23, 1982

INVENTOR(S) : Erps et al.

It is certified that error appears in the above—identified patent and that said Letters Patent is hereby corrected as shown below:

Column 18, line 53, "supplied" should be --supplies

Column 23, line 30, "$y_{10}$" should be --$t_{10}$--

Column 24, line 11, "requied" should be --required--

Column 31, line 19, "$\Delta f$" should be -- $\Delta f_d$--

Column 32, line 33, delete "of"

Column 33, line 1, "claim" should be --claims-- lines 58/59, "magntiude" should be --magnitudeline 63, "signal" should be --single--

Column 35, line 35, "supplied" should be --supplies-- line 57, "sand" should be --said--

Column 36, line 2, "integal" should be --integral--

Signed and Sealed this

Twelfth Day of July 1983

[SEAL]

Attest:

GERALD J. MOSSINGHOFF

Attesting Officer

Commissioner of Patents and Trademarks